United States Patent
Hsieh

(10) Patent No.: US 12,477,861 B2
(45) Date of Patent: Nov. 18, 2025

(54) METHOD OF REPAIRING THE LIGHT EMITTING DEVICE

(71) Applicant: EPISTAR CORPORATION, Hsinchu (TW)

(72) Inventor: Min-Hsun Hsieh, Hsinchu (TW)

(73) Assignee: EPISTAR CORPORATION, Hsinchu (TW)

(*) Notice: Subject to any disclaimer, the term of this patent is extended or adjusted under 35 U.S.C. 154(b) by 0 days.

(21) Appl. No.: 18/375,882

(22) Filed: Oct. 2, 2023

(65) Prior Publication Data

US 2024/0030373 A1 Jan. 25, 2024

Related U.S. Application Data

(63) Continuation of application No. 17/130,712, filed on Dec. 22, 2020, now Pat. No. 11,777,052.

(30) Foreign Application Priority Data

Dec. 27, 2019 (TW) ................................. 108148154

(51) Int. Cl.
*H10H 20/01* (2025.01)
*H01L 21/66* (2006.01)
*H10H 20/857* (2025.01)

(52) U.S. Cl.
CPC ............ *H10H 20/01* (2025.01); *H01L 22/22* (2013.01); *H10H 20/857* (2025.01); *H10H 20/0364* (2025.01)

(58) Field of Classification Search
CPC ............ H01L 33/0095; H01L 25/0753; H01L 27/153; H01L 22/22; H10H 20/01; H10H 20/857; H10H 20/0364; H10H 29/142; H10H 20/8314; H10H 20/8316
See application file for complete search history.

(56) References Cited

U.S. PATENT DOCUMENTS

| | | |
|---|---|---|
| 2014/0159251 A1 | 6/2014 | Marimuthu et al. |
| 2018/0254391 A1* | 9/2018 | Han ...................... H01L 33/20 |
| 2018/0309019 A1 | 10/2018 | Liao |
| 2020/0219839 A1 | 7/2020 | Wu et al. |
| 2020/0235076 A1 | 7/2020 | Batres et al. |
| 2020/0369030 A1 | 11/2020 | Scott |
| 2021/0005557 A1* | 1/2021 | Meyer ..................... H01L 24/97 |
| 2021/0110748 A1* | 4/2021 | Kim ................... H01L 33/0095 |
| 2021/0175202 A1 | 6/2021 | Wu et al. |
| 2021/0351317 A1* | 11/2021 | Grosso .................... H01L 33/58 |
| 2022/0181293 A1 | 6/2022 | Liao |

FOREIGN PATENT DOCUMENTS

| | | |
|---|---|---|
| CN | 108735872 A | 11/2018 |
| CN | 110444558 A | 11/2019 |
| KR | 10-2008-0070832 A | 7/2008 |
| KR | 10-2018-0087896 A | 8/2018 |

* cited by examiner

*Primary Examiner* — Ratisha Mehta
(74) *Attorney, Agent, or Firm* — Patterson + Sheridan, LLP

(57) ABSTRACT

A method of repairing a light emitting device, comprises: providing a light emitting device comprising a carrier board and a first light emitting unit; destroying the first light emitting unit and forming a removal surface on the light emitting device; planarizing the removal surface; providing a bonding structure on the removal surface; and fixing a second light emitting unit on the planarized removal surface through the bonding material.

20 Claims, 13 Drawing Sheets

METHOD OF REPAIRING THE LIGHT EMITTING DEVICE

RELATED APPLICATION DATA

This application is a continuation application of U.S. application Ser. No. 17/130,712, filed on Dec. 22, 2020, which claims the right of priority of TW Application No. 108148154, filed on Dec. 27, 2019, and the content of which is hereby incorporated by reference in its entirety.

TECHNICAL FIELD

The application is related to a light emitting device and the manufacturing method thereof, especially related to a method of repairing a damaged light emitting unit of the light emitting device.

DESCRIPTION OF BACKGROUND ART

Light Emitting Diode (LED) has the characteristics of low power consumption, low heat generation, long operating life, high impact resistance, small size and high response speed, so it is widely used in various fields which need light emitting elements, for example, vehicles, home appliances, display screens and lighting fixtures.

LEDs are devices for emitting monochromatic light, which can be used as a pixel in a display. For example, they can be used as pixels for outdoor or indoor display screens, and improving the resolution of the display is one of the current technological development trends. For example, when miniaturizing the LEDs for pixels, if the LEDs do not have growth substrates or have thinned substrates, the mechanical strength of the LEDs is reduced so the LEDs can be broken easily. In a display, the quantity of LEDs used as pixels is huge and the sizes thereof are very small. When the pixel is damaged and needs repair, it is not easy to remove and replace the damaged LED(s).

SUMMARY OF THE DISCLOSURE

A method of repairing a light emitting device, comprises: providing a light emitting device comprising a carrier board and a first light emitting unit; destroying the first light emitting unit and forming a removal surface on the light emitting device; planarizing the removal surface; providing a bonding structure on the removal surface; and fixing a second light emitting unit on the planarized removal surface through the bonding material.

A light emitting device comprises a carrier board, comprising an upper surface, a first electrode pad and a second electrode pad, wherein the first electrode pad and the second electrode pad on the upper surface; a light emitting unit on the carrier board, wherein the light emitting unit comprises a lower side, a first electrode and a second electrode on the lower side and facing the carrier board; a first conductive body between the first electrode and the first electrode pad; a second conductive body between the second electrode and the second electrode pad; and an insulating structure between the light emitting unit and the carrier board and surrounding the first conductive body and the second conductive body; wherein the insulating structure has a first outside surface, and the first outside surface is discontinuous smooth.

DETAILED DESCRIPTION OF PREFERRED EMBODIMENTS

Figure 1A:
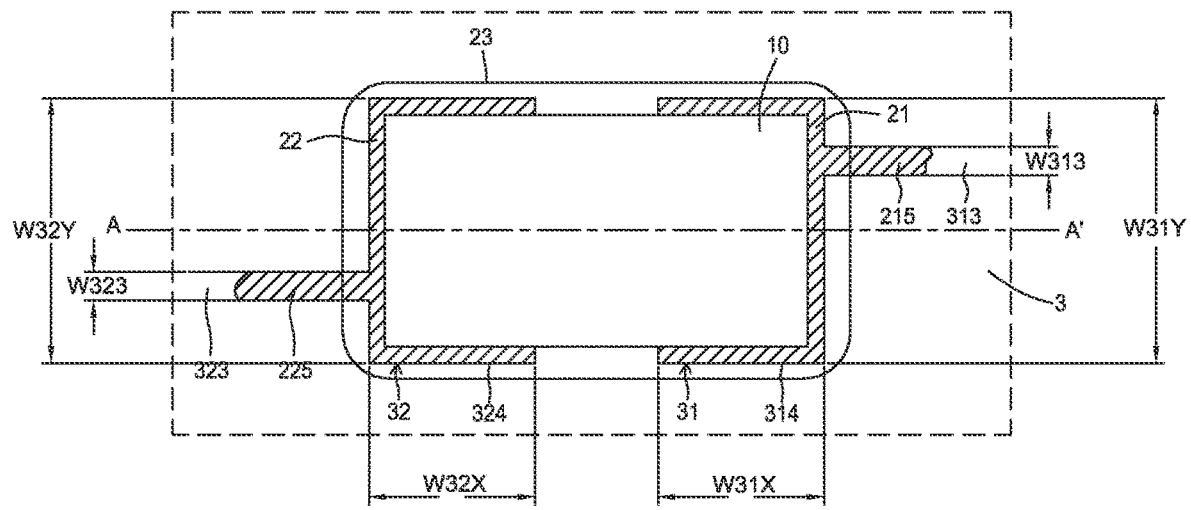
FIG. 1A shows a partial top view of a light emitting device according to one embodiment in the present disclosure.

The following embodiments accompany the drawings to illustrate the concept of the present invention. In the drawings or descriptions, similar or identical parts use the same reference numerals, and in the drawings, the shape, thickness or height of the element is can be reasonably expanded or reduced. The embodiments listed in the present application are only used to illustrate the present application and are not used to limit the scope of the present application. Any obvious modification or change made to the present application does not depart from the spirit and scope of the present application.

Figure 1B:
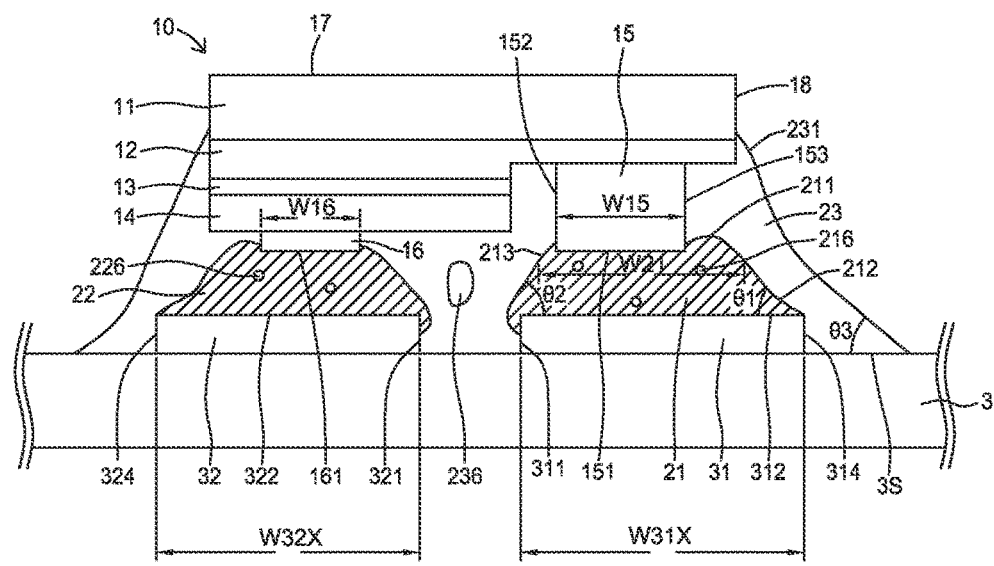
FIG. 1B shows a partial cross-sectional view of a light emitting device according to one embodiment in the present disclosure.

FIGS. 1A to 1B are partial diagrams of a light emitting device according to an embodiment of the disclosure. FIG. 1A shows a partial top view of the light emitting device 100 with a damaged light emitting unit 10 to be repaired. The light emitting device 100 includes a carrier board 3, a first electrode pad 31, a second electrode pad 32, a first conductive wire 313, a second conductive wire 323, a first conductive body 21, a second conductive body 22, an insulating structure 23, and a light emitting unit 10. The first electrode pad 31 and the second electrode pad 32 are located on the carrier board 3, and the light emitting unit 10 is fixed on and connected to the first electrode pad 31 and the second electrode pad 32. As shown in FIG. 1A, the first conductive wire 313 extends outward from the first electrode pad 31 and has a smaller width W313 than a width W31Y of the first electrode pad 31, and the second conductive wire 323 extends outward from the second electrode pad 32 and has a smaller width W323 than a width W32Y of the first electrode pad 32. The insulating structure 23 surrounds the circumference of the light emitting unit 10 and fills the space between the first electrode pad 31 and the second electrode pad 32. In FIG. 1A (top view), the area of the region surrounded by the outer contour of the insulating structure 23 projected on the carrier board 3 is defined as a projected area of the insulating structure 23, and the area of the light emitting unit 10 projected on the carrier board 3 is defined as a projected area of the light emitting unit 10. The projected area of the insulating structure 23 is larger than the projected area of the light emitting unit 10. The ratio of the projected area of the insulating structure 23 to the projected area of the light emitting unit 10 is about 1 to 1.5. The projected area of the insulating structure 23 preferably does not overlap with the projected area of the adjacent light emitting unit 10 or the projected area of the adjacent insulating structure 23 which surrounds the adjacent light emitting unit 10. The outer sidewall 314 of the first electrode pad 31 and the outer sidewall 324 of the second electrode pad 32 are surrounded by an insulating structure 23. The first conductive body 21 has a portion 215 extending from the first electrode pad 31 to the first conductive wire 313 and is not covered by the insulating structure 23. The second conductive body 22 has a portion 225 extending from the second electrode pad 32 to the second conductive wire 323 and is not covered by the insulating structure 23.

FIG. 1B is a cross-sectional view of FIG. 1A along the line AA'. The light emitting device 100 includes the carrier board 3 and the light emitting unit 10 fixed on the carrier board 3. The light emitting unit 10 is a semiconductor light emitting element, such as a light emitting diode (Light emitting Diode; LED), a laser diode (Laser Diode), which includes, sequentially located below a substrate 11, a first semiconductor layer 12, active layer 13, and a second semiconductor layer 14. The first semiconductor layer 12 and the second semiconductor layer 14 can respectively provide electrons and holes so that the electrons and holes are recombined in the active layer 13 to emit light. The first semiconductor layer 12, the active layer 13, and the second semiconductor layer 14 may include III-V group semiconductor materials, such as $Al_xIn_yGa_{(1-x-y)}N$ or $Al_xIn_yGa_{(1-x-y)}P$, where $0 \le x, y \le 1$; $(x+y) \le 1$. According to the material of the active layer 13, the light emitting unit 10 can emit a red light with a peak wavelength between 610 nm and 650 nm, a green light with a peak wavelength between 530 nm and 570 nm, a blue light with peak wavelength between 450 nm and 490 nm, a purple light with a peak wavelength between 400 nm and 450 nm, or ultraviolet light with a peak wavelength between 280 nm and 400 nm. The light emitting unit 10 has a first electrode 15 and a second electrode 16. Both the first electrode 15 and the second electrode 16 are located on the lower side of the light emitting unit 10 with respect to the light emitting surface 17. The first electrode 15 is electrically connected to the first semiconductor layer 12 and the second electrode 16 is electrically connected to the second semiconductor layer 14. The lower surfaces 151, 161 of the first electrode 15 and the second electrode 16 can be respectively located at the same or different level relative to the upper surface 3S of the carrier board 3. However, it is better that the lower surfaces 151, 161 are substantially coplanar, which can maintain the light emitting surface 17 of the light emitting device 100 in a fixed direction, for example, parallel to the carrier board 3. In another embodiment, the lower surfaces 151 and 161 of the first electrode 15 and the second electrode 16 are not coplanar, and the lower surface 151 of the first electrode 15 is slightly higher than the lower surface 161 of the second electrode 16 relative to the upper surface 3S of the carrier board 3. The carrier board 3 has a first electrode pad 31 corresponding to the first electrode 15 of the light emitting unit 10 and a second electrode pad 32 corresponding to the second electrode 16 of the light emitting unit 10. As FIG. 1B shows, the width W31X of the first electrode pad 31 is greater than the width W15 of the first electrode 15, and the width W32X of the second electrode pad 32 is greater than the width W16 of the second electrode 16. Viewing from the top, the areas of the first electrode pad 31, the second electrode pad 32, the first electrode 15 and the second electrode 16 projected on the carrier board 3 are respectively defined as projected areas of the first electrode pad 31, the second electrode pad 32, the first electrode 15 and the second electrode 16. The projected area of the first electrode pad 31 is larger than the projected area of the first electrode 15, and the projected area of the second electrode pad 32 is larger than the projected area of the second electrode 16. The material of the first electrode 15 and the second electrode 16 can be metal, such as gold (Au), silver (Ag), copper (Cu), chromium (Cr), aluminum (Al), platinum (Pt), nickel (Ni), titanium (Ti), tin (Sn), or the alloys thereof, or the laminate combinations thereof.

There is a bonding structure between the light emitting unit 10 and the carrier board 3. The bonding structure includes the first conductive body 21, the second conductive body 22 and the insulating structure 23. The first conductive body 21 is located between the first electrode 15 and the first electrode pad 31. The second conductive body 22 is located between the second electrode 16 and the second electrode pad 32. Depending on the process conditions, the first conductive body 21 may have a plurality of discrete holes 216 and the second conductive body 22 may also have a plurality of discrete holes 226. The holes 216 and 226 may contain gas, such as air, insulating materials, or a combination thereof. Taking the combined structure of the first electrode 15, the first conductive body 21, and the first electrode pad 31 shown in FIG. 1B as an example, the lower surface 151 of the first electrode 15 is completely covered by the first conductive body 21. Most or all the holes 216 in the first conductive body 21 are not connected to each other, and there is no hole touching the first electrode 15 and the first electrode pad 31 at the same time. The first electrode 15 has an inner surface 152 facing the second electrode 16 and is partially covered by the first conductive body 21. The first electrode 15 has an outer surface 153 which faces outside of the light emitting unit 10 and is partially covered by the first conductive body 21. The first electrode pad 31 has an inner surface 311 facing the second electrode pad 32 and is partially covered by the first conductive body 21. The first conductive body 21 has an outer surface 212 have a normal parallel to the outermost surface 18 of the light emitting unit 10 and has a curved surface with a peak 211. Taking the upper surface 3S of the carrier board 3 as a reference, the peak 211 is higher than the lower surface 151 of the first electrode 15. In one embodiment, the normal of the outer sidewall 314 of the first electrode pad 31 is parallel to the normal of the outermost surface 18 of the light emitting unit 10 and a part of the outer sidewall 314 is covered by the first conductive body 21.

The outer surface 212 of the first conductive body 21 has a first portion extending from the peak 211 toward the lower surface 151 of the first electrode 15 and a second portion extending downward from the peak 211 toward the first electrode pad 31. There is an angle θ1 between the outer surface 212 of the first conductor 21 and the upper surface 312 of the first electrode pad 31, and the angle θ1 gradually increases along the outer surface 212 toward the outer surface 153 of the first electrode 15. The first conductive body 21 has an inner surface 213 facing the second electrode 16 and has an inwardly concave or outwardly convex contour. There is an angle θ2 between the inner surface 213 of the first conductive body 21 and the upper surface 312 of the first electrode pad 31. Taking the upper surface 3S of the carrier board 3 as a reference, the width W21 of the first conductive body 21 gradually decreases along the direction from the first electrode pad 31 to the first electrode 15 so θ2>θ1. The contact width between the first conductive body 21 and the first electrode pad 31, which can be equivalent to the width W31X of the first electrode pad 31 shown in FIG. 1B, is about 1 to 3 times the width W15 of the first electrode 15, and preferably 1~2 times. The combined structure of the second electrode 16, the second conductive body 22, and the second electrode pad 32 is the same as the combined structure of the first electrode 15, the first conductive body 21, and the first electrode pad 31, and will not repeat hereafter. The first conductive body 21 preferably only directly contacts the first electrode 15 and does not contact other parts of the light emitting unit 10, such as the first semiconductor layer 12, the active layer 13, and the second semiconductor layer 14. The second conductive body 22 preferably only directly contacts the second electrode 16 and does not contact other parts of the light emitting unit 10, such as the first semiconductor layer 12, the active layer 13, and the second semiconductor layer 14.

The insulating structure 23 surrounds or covers the first conductive body 21, the second conductive body 22, the first electrode 15, the second electrode 16, a portion of the outermost surface 18 of the light emitting unit 10, the inner surface 311 and a part of the upper surface 312 of the first electrode pad 31, and the inner surface 321 and a part of the upper surface 322 of the second electrode pad 32. In an embodiment, the insulating structure 23 covers the side surfaces of the first semiconductor layer 12, the active layer 13, and the second semiconductor layer 14 of the light emitting unit 10 completely, but only covers a part of the side surface of the substrate 11. The insulating structure 23 can enhance the bonding strength between the light emitting unit 10 and the carrier board 3, prevent or alleviate the oxidation of the conductive bodies 21, 22 due to environmental substances, and prevent the conductive bodies 21, 22 from being short-circuited caused by being softened or melted in a high temperature environment. In other words, the melting point of the insulating structure 23 after curing process is preferably higher than the melting point of the conductive bodies 21 and 22 after curing process.

There is an angle θ3 between the outer surface 231 of the insulating structure 23 and the upper surface 3S of the carrier board 3, and the angle θ3 gradually increases along the outer surface 231 toward the light emitting unit 10. In FIG. 1B, taking the carrier board 3 as a reference, at the same level, θ3>θ1. Depending on the process conditions, the insulating structure 23 between the first conductive body 21 and the second conductive body 22 has one hole 236. The hole 236 may contain gas, such as air, a material forming the conductive body, or a combination thereof. In another embodiment, the insulating structure 23 located between the first conductive body 21 and the second conductive body 22 does not have holes.

The first conductive body 21 and the second conductive body 22 may include a metal with a low melting point or an alloy with a low liquidus point, and the melting point or the liquefaction temperature is lower than 210° C. The metal material may be an element, a compound, or an alloy, such as bismuth (Bi), tin (Sn), silver (Ag), indium (In), or alloys thereof. In one embodiment, the melting point or liquefaction temperature of the low melting point metal or low liquefaction melting point alloy is lower than 170° C. The material of the low liquefaction melting point alloy may be tin-indium alloy or tin-bismuth alloy. The insulating structure 23 may be a thermosetting polymer, such as epoxy, silicone, polymethyl methacrylate, and episulfide. The insulating structure 23 can be cured at a curing temperature. In this embodiment, the melting points of the first conductive body 21 and the second conductive body 22 are lower than the solidification temperature of the insulating structure 23. For example, the first and second conductive bodies 21, 22 contain a tin-bismuth (BiSn) alloy, and the melting point thereof is about 138° C.

In one embodiment, the insulating structure 23 is light-transmissible, which is transparent or semi-transparent. In another embodiment, the insulating structure 23 can include a light-absorbing substance to make the insulating structure 23 appear dark, such as black or gray. When the light emitting device 100 is applied to a display, a dark insulating material can increase the contrast of the display. In another embodiment, the insulating structure 23 can include a highly reflective material to make the insulating structure appear light color, such as white, to reflect upward light which originally goes toward the carrier board 3 for increasing the light intensity above the light emitting surface 17 of the light emitting device 100. The light-absorbing material can be carbon black or dark pigment. The highly reflective material may be silicon oxide, titanium oxide, zinc oxide, aluminum oxide, barium sulfate, or calcium carbonate.

Figure 1C:
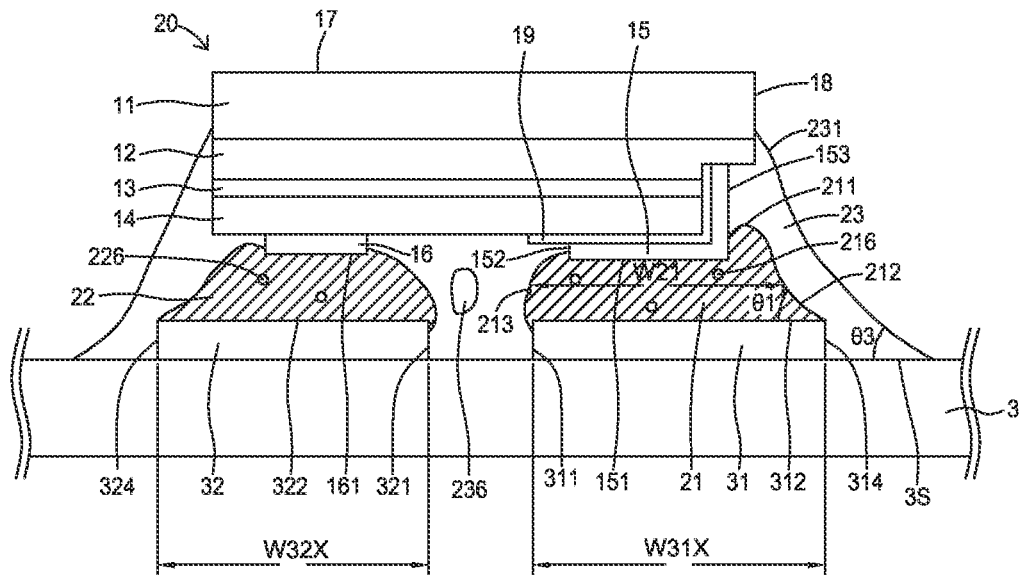
FIG. 1C shows a partial cross-sectional view of a light emitting device according to another embodiment in the present disclosure.

FIG. 1C is a cross-sectional view taken along line AA' in FIG. 1A according to another embodiment of the disclosure. The light emitting device 100 includes a carrier board 3 and a light emitting unit 20 fixed on the carrier board 3. The light emitting unit 20 includes a first semiconductor layer 12, an active layer 13, and a second semiconductor layer 14 located under the substrate 11 sequentially. The protective layer 19 covers a part of the lower surface and a part of the side surface of the first semiconductor layer 12, the side surface of the active layer 13, and a part of the lower surface and the side surface of the second semiconductor layer 14. The light emitting unit 20 has a first electrode 15 and a second electrode 16 located on the lower side of the light emitting unit 20 relative to the light emitting surface 17. The first electrode 15 is electrically connected to the first semiconductor layer 12 and covers part of the lower surface of the first semiconductor layer 12, the side surface of the protective layer 19, and a part of the lower surface of the protective layer 19. Compared with the light emitting unit 10 in FIG. 1B, the overlapping of the first electrode 15 and the second semiconductor layer 14 can achieve a larger area for contacting with the first conductive body 21 and the area of the active layer 13 can also be larger. In other words, the light emitting unit 20 with the protective layer 19 in FIG. 1C can have a larger light emitting area and a larger electrode area, which can help to improve the bonding yield in the subsequent die bonding processes. Taking the upper surface 3S of the carrier board 3 as a reference, a part of the first electrode 15 and the second semiconductor layer 14, the active layer 13, and the first semiconductor layer 12 overlap each other. The first electrode 15 is electrically insulated from the second electrode 16 and the second semiconductor layer 14 by the protective layer 19. The lower surfaces 151, 161 of the first electrode 15 and the second electrode 16 can be located at the same or different level relative to the upper surface 3S of the carrier board 3, but it is better that the two lower surfaces 151, 161 are substantially coplanar, which can maintain the light emitting surface 17 of the light emitting device 100 in a fixed direction, for example, parallel to the upper surface 3S of the carrier board 3. The first conductive body 21 preferably only directly contacts the first electrode 15 and does not contact other parts of the light emitting unit 20, such as the protective layer 19, the first semiconductor layer 12, the active layer 13, and the second semiconductor layer 14. The second conductive body 22 preferably only directly contacts the second electrode 16 and does not contact other parts of the light emitting unit 20, such as the protective layer 19, the first semiconductor layer 12, the active layer 13, and the second semiconductor layer 14. In the embodiment, the materials and structures of the first conductive body 21, the second conductive body 22, the second electrode 16, the first electrode pad 31, the second electrode pad 32, and the insulating structure 23 are the same as those in FIG. 1B so the corresponding descriptions will not repeat hereafter.

Figure 1D:
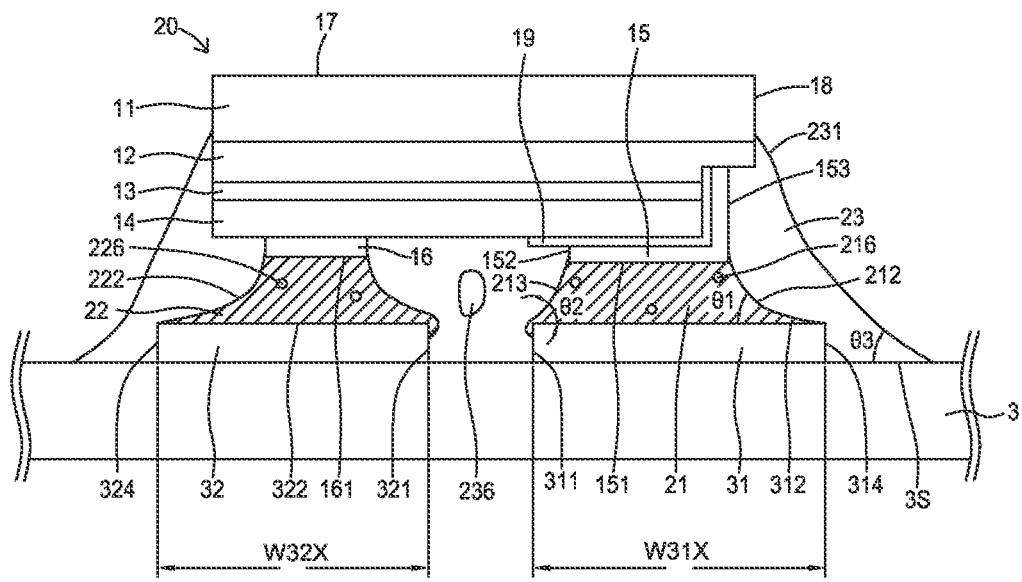
FIG. 1D shows a partial cross-sectional view of a light emitting device according to another embodiment in the present disclosure.

As shown in FIG. 1D, in another embodiment, the outer surfaces 212, 222 of the first conductive body 21 or/and the second conductive body 22 do not have peaks. FIG. 1D is a cross-sectional view taken along the line AA' in FIG. 1A. The light emitting device 100 includes a carrier board 3 and the light emitting unit 20 is fixed on the carrier board 3. For the description of the material and structure of the light emitting unit 20 can be referred to the relevant paragraphs in FIG. 1C. A bonding structure is provided between the light emitting unit 20 and the carrier board 3. The bonding structure includes the first conductive body 21, the second conductive body 22 and the insulating structure 23. The first conductive body 21 is located between the first electrode 15 and the first electrode pad 31. The second conductive body 22 is located between the second electrode 16 and the second electrode pad 32. Depending on the process conditions, the first conductive body 21 may have a plurality of discrete holes 216 and the second conductive body 22 may also have a plurality of discrete holes 226. The holes 216, 226 may contain gas, insulating materials, or a combination thereof. Taking the combined structure of the first electrode 15, the first conductive body 21, and the first electrode pad 31 as an example, the lower surface 151 of the first electrode 15 is completely covered by the first conductive body 21. Most or each of the holes 216 in the first conductive body 21 is not connected to each other and do not touch the first electrode 15 and the first electrode pad 31 at the same time. The outer surface 212 of the first conductive body 21 and the outer surface 222 of the second conductive body 22 do not have peaks, but have curved surfaces. The outer surface 212 of the first conductive body 21 extends from the first electrode 15 to the first electrode pad 31 and has a concave curved surface. The outer surface 222 of the second conductive body 22 extends from the second electrode 16 to the second electrode pad 32 and has a concave curved surface. Taking the upper surface 3S of the carrier board 3 as a reference, there is an angle θ1 between the outer surface 212 of the first conductive body 21 and the upper surface 312 of the first electrode pad 31, and the angle θ1 gradually increases along the direction from the outer surface 212 to the outer surface 153 of the first electrode 15. The first electrical conductive body 21 has an inner surface 213 facing the second electrode 16 and has a concave or convex contour. There is an angle θ2 between the inner surface 213 of the first conductive body 21 and the upper surface 312 of the first electrode pad 31. Taking the upper surface 3S of the carrier board 3 as a reference, the width W21 of the first conductive body 21 gradually decreases so θ2 is larger than θ1. The contact width between the first conductive body 21 and the first electrode pad 31, which can be equivalent to the width W31X of the first electrode pad 31 shown in FIG. 1D, is about 1 to 3 times the width W15 of the first electrode 15, preferably 1~2 times. The combined structure relationship between the second electrode 16, the second conductive body 22 and the second electrode pad 32 is the same as the structure of the first electrode 15, the first conductive body 21 and the first electrode pad 31, so the corresponding descriptions will not be described again. The materials and structures of the first electrode 15, the second electrode 16, the first electrode pad 31, the second electrode pad 32, and the insulating structure 23 are the same as those disclosed in FIG. 1B, so the corresponding descriptions will not be described again.

Figure 1E:
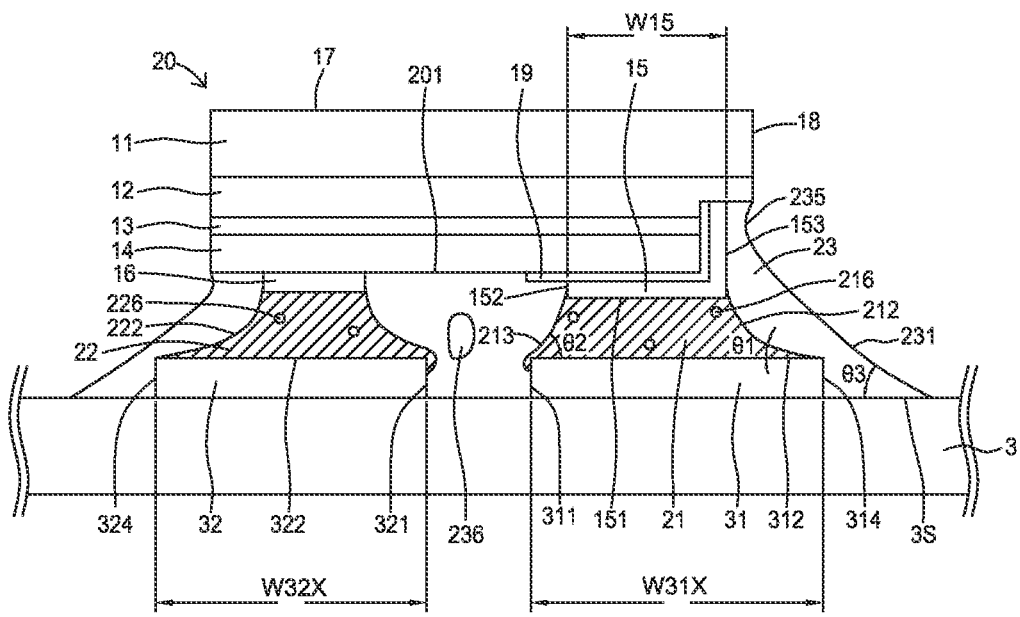
FIG. 1E is a partial cross-sectional view of a light emitting device according to another embodiment in the present disclosure.

As shown in FIG. 1E, in another embodiment, the insulating structure 23 does not cover the outermost surface 18 of the light emitting unit 20. FIG. 1E is a cross-sectional view taken along the line AA' in FIG. 1A. The light emitting device 100 includes a carrier board 3 and the light emitting unit 20 is fixed on the carrier board 3. The material and structure of the light emitting unit 20 can be referred to the paragraphs related to FIG. 1C. A bonding structure is provided between the light emitting unit 20 and the carrier board 3. The bonding structure includes the first conductive body 21, the second conductive body 22 and the insulating structure 23. The first conductive body 21 is located between the first electrode 15 and the first electrode pad 31. The second conductive body 22 is located between the second electrode 16 and the second electrode pad 32. Depending on the process conditions, the first conductive body 21 may have a plurality of discrete holes 216 and the second conductive body 22 may have a plurality of discrete holes 226. The holes 216 and 226 may be gas or insulating material, or a combination thereof. Taking the combined structure of the first electrode 15, the first conductive body 21, and the first electrode pad 31 as an example, the lower surface 151 of the first electrode 15 is completely covered by the first conductive body 21. The holes 216 in the first conductive body 21 are not connected to each other and do not touch the first electrode 15 and the first electrode pad 31 at the same time. The first electrode 15 has an inner surface 152 facing the second electrode 16 and is partially covered by the first conductive body 21. The first electrode 15 has an outer surface 153 facing the outermost surface 18 of the light emitting unit 20 and is partially covered by the first conductive body 21. The first electrode pad 31 has an inner surface 311 facing the second electrode pad 32 and is partially covered by the first conductive body 21. In an embodiment, the normal of the outer side wall 314 of the first electrode pad 31 is parallel to the normal of the outermost surface 18 of the light emitting unit 20, and a part of the outer side wall 314 is covered by the first conductive body 21. The first conductive body 21 has an outer surface 212 have a normal parallel to the normal of the outermost surface 18 of the light emitting unit 20, and the outermost surface 18 has a concave curved surface. There is an angle θ1 between the outer surface 212 of the first conductive body 21 and the upper surface 312 of the first electrode pad 31, and the angle θ1 gradually increases along the outer surface 212 toward the outer surface 153 of the first electrode 15. The first conductor 21 has an inner surface 213 facing the second electrode 16 and has a concave or convex contour. There is an angle θ2 between the inner surface 213 of the first conductive body 21 and the upper surface 312 of the first electrode pad 31. Taking the upper surface 3S of the carrier board 3 as a reference, the width W21 of the first conductive body 21 gradually decreases so θ2 is larger than θ1. The contact width between the first conductor 21 and the first electrode pad 31, which can be equivalent to the width W31X of the first electrode pad 31 shown in FIG. 1E, is about 1 to 3 times the width W15 of the first electrode 15, and preferably 1~2 times. The combined structure relationship of the second electrode 16, the second conductor 22, and the second electrode pad 32 is the same as the structure of the first electrode 15, the first conductor 21, and the first electrode pad 31 so the corresponding descriptions will not be described hereinafter.

The insulating structure 23 surrounds the first conductive body 21, the second conductive body 22, the first electrode 15, the second electrode 16, the inner surface 311 and a part of the upper surface 312 of the first electrode pad 31, and the inner surface 321 and a part of the upper surface 322 of the second electrode pad 32. The insulating structure 23 covers the lower surface 201 of the light emitting unit 20 and does not cover the outermost surface 18 of the light emitting unit 20. In another embodiment, the lower surface of the light emitting unit 20 close to the outermost surface 18 is not covered by the insulating structure 23 (not shown). In other words, the lower surface of the light emitting unit 20 close to the outermost surface 18 is not covered by the insulating structure 23. Taking the upper surface 3S of the carrier board 3 as a reference, the outer surface 231 of the insulating structure 23 has a recess 235 retracted from the outermost surface 18 of the light emitting unit 20. There is an angle θ3 between the outer surface 231 of the insulating structure 23 and the upper surface 3S of the carrier board 3, and the angle θ3 gradually increases toward the light emitting unit 10 along the outer surface 231. In the sectional view of FIG. 1E, taking the upper surface 3S of the carrier board 3 as a reference, θ3 is larger than θ1.

Figure 2:
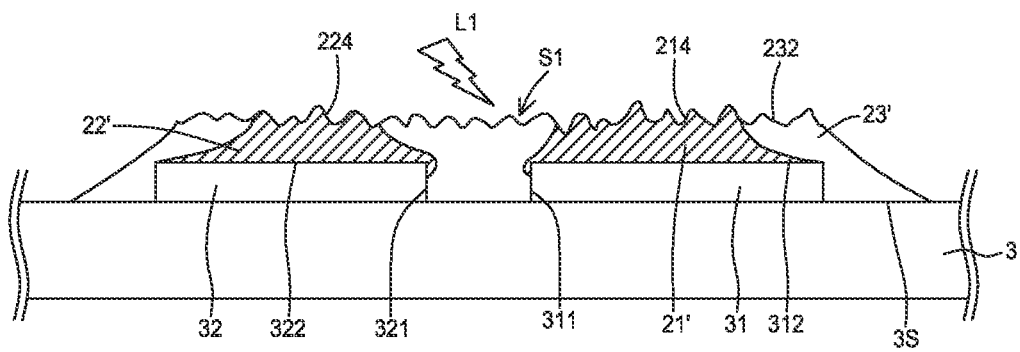
FIGS. 2 to 3 show the steps of removing the light emitting unit according to one embodiment.
Figure 3:
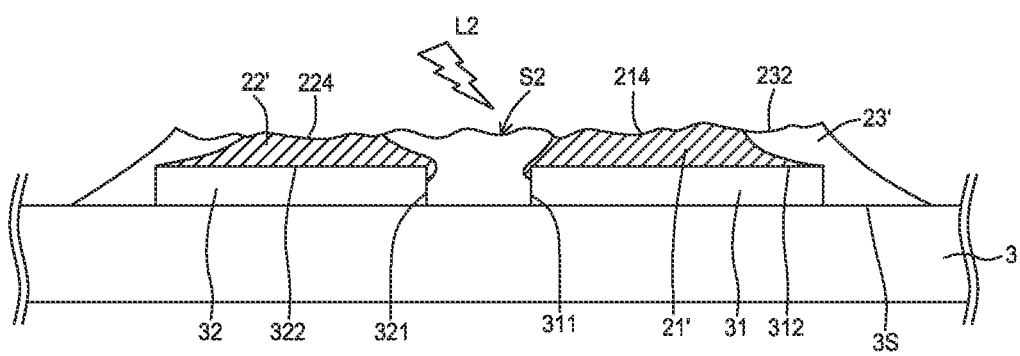

FIGS. 2 to 3 show diagrams of removing the damaged light emitting unit 10 or the light emitting unit 20 to be repaired. As shown in FIG. 2, laser energy L1 is provided to irradiate a light emitting unit to be repaired for removing the light emitting unit, a part of the first conductive body 21, a part of the second conductive body 22, and a part of the insulating structure 23. The number of the laser L1 irradiation is not limited to one time, and the position of the laser L1 is not limited a fixed position. When the number of laser irradiation is greater than one, the laser irradiations can have the same wavelength and energy, have the same wavelength and different energies, have the same energies and different wavelengths, or different wavelengths and energies. In an embodiment, the laser L1 irradiates two different positions, one irradiates above the first conductive body 21, and another irradiates above the second conductive body 22 for removing the light emitting unit. In another embodiment, the laser L1 irradiates three times. In the first time, the laser L irradiates the middle position between the first conductive body 21 and the second conductive body 22 for removing a part of the light emitting unit. Afterwards, the top of the first conductive body 21 and the top of the second conductive body 22 are irradiated by the laser L respectively to remove the remaining light emitting unit. After the light emitting unit be removed, the carrier board 3 still contains the first electrode pad 31, the second electrode pad 32, the remaining first conductive body 21', the remaining second conductive body 22', and the remaining insulating structure 23'. The first electrode pad 31 and the second electrode pad 32 are not removed by the laser L1, and the upper portions thereof are covered by the first conductive body 21', the second conductive body 22', and the insulating structure 23'. After the light emitting unit is removed, the first conductive body 21', the second conductive body 22', and the insulating structure 23' have a rough exposed surface S1 above thereof. The rough exposed surface S1 includes the upper surface 214 of the first conductive body 21', the upper surface 224 of the second conductive body 22', and the upper surface 232 of the insulating structure 23'. The upper surface 232 of the insulating structure 23' surrounds the upper surface 214 of the first conductive body 21' and the upper surface 224 of the second conductive body 22'.

When using the laser L1 to remove the light emitting unit, there are residues of the light emitting unit or by-products generated by the laser on the rough exposed surface S1, so the rough exposed surface S1 needs to be cleaned or planarized by processes like polishing, blasting, etching, or laser irradiation to flatten the rough exposed surface S1 and form the removal surface S2 and remove the residue or the by-products on the rough exposed surface S1, as shown in FIG. 3. The roughness of the removal surface S2 is smaller than the roughness of the rough exposed surface S1, so when another light emitting unit without damage is bonded on the removal surface S2 subsequently, the light emitting unit has a better bonding force with the carrier board 3. In one embodiment, a laser L2 is used in the planarization process, and the laser L2 and the laser L1, which is used for removing the light emitting unit, can have the same band and different energy, or have different bands. According to the amount of laser energy, the irradiation time of laser L2 can be different from or the same as that of laser L1. During the planarization process, the upper portions of the first electrode pad 31 and the second electrode pad 32 are still covered by the first conductive body 21', the second conductive body 22', and the insulating structure 23'. The method of measuring roughness mentioned above can comprise steps of: dividing a cross-sectional view of a rough surface into a plurality of line segments with equal horizontal distances, measuring a height difference between the highest wave crest and the lowest wave trough in each of the plurality of line segments, and defining this height difference as the maximum height of the profile of each line segment. The average of the maximum heights of the profiles of all the line segments can be defined as the roughness of rough surface. When the maximum height of the profile is larger, the surface is rougher. In other words, the larger the height difference between the concave and convex surfaces on a rough surface, the rougher the surface.

In one embodiment, referring to FIG. 2, when the laser L1 for removing the light emitting unit irradiates three times, the middle position between the first conductive body 21 and the second conductive body 22 is irradiated firstly so most portion of light emitting unit is removed. And then, the upper portions of the first conductive body 21 and the second conductive body 22 are irradiated respectively to remove the residue of the light emitting unit. If the rough exposed surface S1 is flat enough after performing the above steps, the planarization process disclosed in FIG. 3 is not necessary.

The laser L1 and/or laser L2 can be a pulsed laser, and the laser band thereof can be infrared or green light. For example, the infrared light with a wavelength of 1064 nm±0.5 nm, green light with a wavelength of 532 nm±0.5 nm. The Repetition Ratio can be 1 Hz~100 Hz or 1 KHz~10 KHz. Pulse Width can be ≤15 ns. The output pulse energy can be ≥4 mJ. In one embodiment, laser L1 and/or laser L2 is infrared light (1064 nm), the output pulse energy is ≥8 mJ, the pulse width is ≤12 ns, and the repetition ratio is 1 Hz-100 Hz. In another embodiment, laser L1 and/or laser L2 is green light (532 nm), the output pulse energy is ≥4 mJ, the pulse width ≤12 ns, and the pulse repetition ratio is 1 Hz-100 Hz.

In another embodiment, a milling cutter (not shown in the figure) can replace the laser to perform the aforementioned removal and planarization process, and the milling cutter with appropriate size can be used to remove the damaged and to-be-repaired light emitting unit 10 or light emitting unit 20 and flatten the rough exposed surfaces S1 and removal surfaces S2. In the process of milling, in order to avoid contamination of the removal surface or the adjacent area by the chips, a dust collector can be used to remove the chips produced by the milling from the rough exposed surfaces S1 and removal surfaces S2.

Figure 4A:
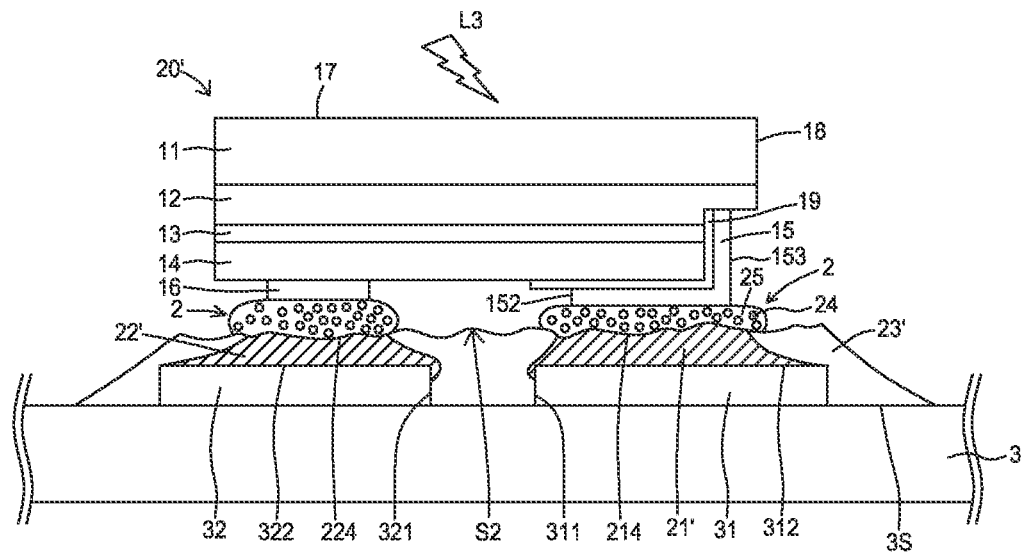
FIG. 4A shows a partial cross-sectional view of a fixed light emitting unit according to one embodiment in the present disclosure.

FIGS. 4A to 5B are diagrams of a new light emitting unit being placed on the removal surface S2 according to an embodiment of the disclosure. FIGS. 4A and 4B take the replacement of a new light emitting unit 20' as an example. In other embodiments, a new light emitting unit 10 can also be replaced. As shown in FIG. 4A, on the removal surface S2, a bonding structure 2 is provided on the upper surface 214 of the first conductive body 21' and the upper surface 224 of the second conductive body 22' for bonding another light emitting unit. The first electrode 15 and the second electrode 16 of the new light emitting unit 20' are corresponding to the first conductive body 21' and the second conductive body 22' on the carrier board respectively. The bonding structure 2 has two physically separated parts, which are respectively coated between the first electrode 15 and the first conductive body 21' and between the second electrode 16 and the second conductive body 22'. The bonding structure 2 covers the removal surface S2, and completely or partially covers the upper surface 214 of the first conductive body 21' and the upper surface 224 of the second conductive body 22'. Preferably, the area covered by the bonding structure 2 does not exceed the outermost edge of the removal surface S2. FIG. 4B shows another embodiment. The bonding structure 2 is formed on the first conductive body 21' and the second conductive body 22' in an integrated manner. In FIG. 4B, the bonding structure 2 is continuously and uninterruptedly distributed on the upper surfaces 214 and 224 of the first conductive body 21' and the second conductive body 22'. The bonding structure 2 covers the removal surface S2, and completely or partially covers the upper surface 214 of the first conductive body 21' and the upper surface 224 of the second conductive body 22'. Preferably, the area covered by the bonding structure 2 does not exceed the outermost edge of the removal surface S2. The bonding structure 2 before curing includes an insulating structure 25 and a plurality of discrete conductive particles 24 dispersed in the insulating structure 25.

Figure 4B:
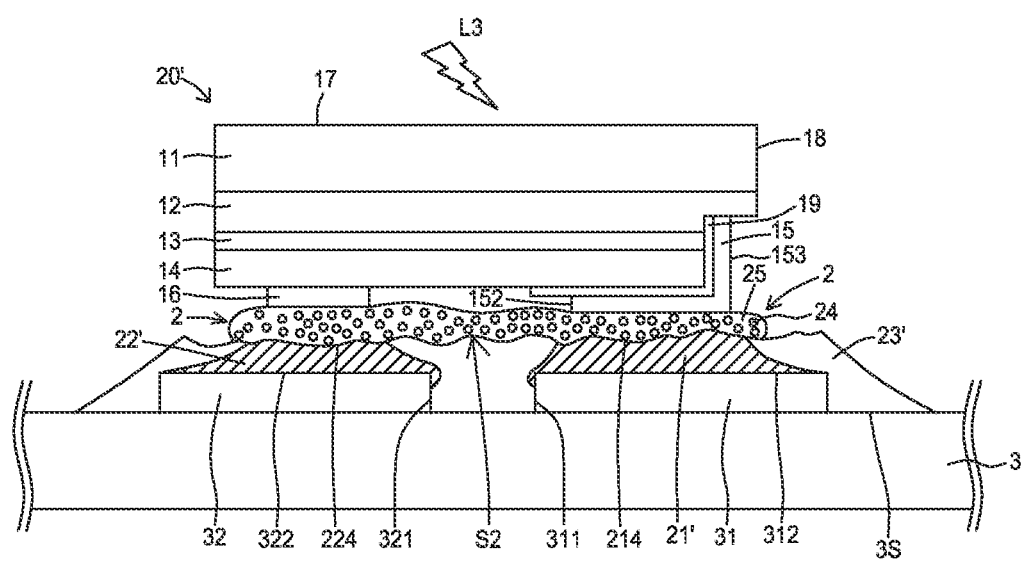
FIG. 4B shows a partial cross-sectional view of a fixed light emitting unit according to another embodiment in the present disclosure.

The plurality of the conductive particles 24 may include a metal with a low melting point or an alloy with a low liquidus point, wherein the melting point or the liquidus point is lower than 210° C. The metal material may be an element, a compound, or an alloy, such as bismuth (Bi), tin (Sn), silver (Ag), indium (In), or alloys thereof. In one embodiment, the melting point or the liquidus point of the low melting point metal or low liquidus melting point alloy is lower than 170° C. The material of the low liquidus melting point alloy may be tin-indium alloy or tin-bismuth alloy. The insulating structure 25 may be a thermosetting polymer, such as epoxy, silicone, polymethyl methacrylate, and episulfide. In one embodiment, the melting point of the plurality of the conductive particles 24 is lower than the curing temperature of the insulating structure 25. As shown in FIGS. 4A to 4B, before the heating (curing) step, the size of the plurality of the conductive particles 24 is defined as the diameter of the plurality of the conductive particles 24 (may be an average diameter, a maximum diameter, or a minimum diameter), which is between 1 □m and 20 □m, for example, 2 □m or 10 □m. The weight ratio of the plurality of the conductive particles 24 to the bonding structure 2 is between 30% and 80%. In one embodiment, when the diameter of the plurality of the conductive particle 24 is approximately 20 m, the weight ratio of the conductive particles 24 to the bonding structure 2 is between 30% and 70%. In another embodiment, when the diameter of the plurality of the conductive particles 24 is approximately 10 □m, the weight ratio of the plurality of the conductive particles 24 to the bonding structure 2 is between 40% and 80%. The shortest distance between the first electrode 15 and the second electrode 16 is preferably more than twice the size of the plurality of the conductive particle 24.

The method of bonding the light emitting unit 20' to the removal surface S2 includes a heat curing step. During the heating process, the temperature of the bonding structure 2 or the process environment is not higher than 170° C. So, the reliability of the light emitting unit 20' is affected slightly. The viscosity of the insulating structure 25 drops firstly and then rises and the conductive particles 24 melts and gathers between or around the first electrode 15 and the first conductive body 21' of the light emitting unit 20, and/or the second electrode 16 and the second conductive body 22'. The heating method can provide energy to locally heat the bonding structure 2 so that the light emitting unit 20' is bonded to the carrier board 3 through the bonding structure 2. In one embodiment, the energy can be transmitted by laser L3 (shown in FIGS. 4A to 4B), such as infrared laser, UV laser. The laser L3 can have the wave band same as the laser L1 and L2 but different energy, or have the wave band different from that of the laser L1 and L2. According to the amount of laser energy, the irradiation time of laser L3 can be different from or the same as that of laser L1 and L2. Since the energy mainly heats the area of the bonding structure 2 and does not or only slightly heat the light emitting unit 20', the reliability of the light emitting unit 20' or other components on the carrier board 3 is affected slightly.

Figure 5A:
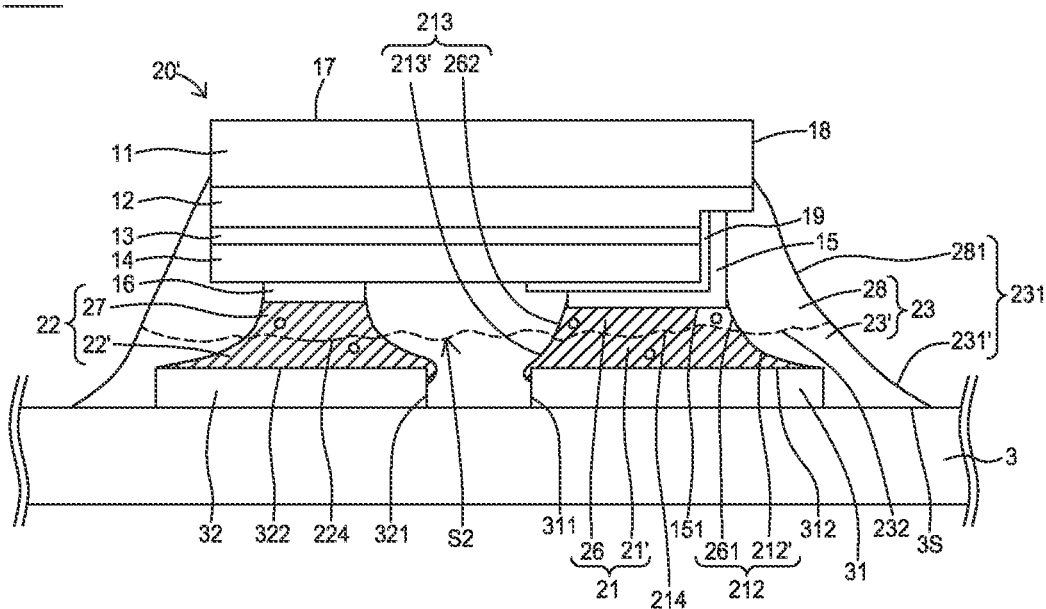
FIG. 5A shows a partial cross-sectional view of a light emitting device according to one embodiment in the present disclosure.

FIG. 5A shows a cured state of the bonding structure 2 according to an embodiment of the disclosure. After the bonding structure 2 is heated and cured, the conductive particles 24 in the bonding structure 2 in FIGS. 4A to 4B gather between the first electrode 15 and the first conductive body 21' to form the third conductive body 26, and between the second electrode 16 and the second conductive body 22' to form the fourth conductive body 27. The insulating structure 25 is cured to form the second insulating structure 28 surrounding the third conductive body 26 and the fourth conductive body 27 and covering part of the outermost surface 18 of the light emitting unit 20'. The third conductive body 26 directly contacts the upper surface 214 of the first conductive body 21' and forms the first conductive body 21 with the first conductive body 21'. The fourth conductive body 27 directly contacts the upper surface 224 of the second conductive body 22' and forms the second conductive body 22 with the second conductive body 22'. The second insulating structure 28 directly contacts the upper surface 232 of the insulating structure 23' and form the insulating structure 23 with the insulating structure 23'. The inner surface 262 of the third electrical conductive body 26 and the inner surface 213' of the first electrical conductive body 21' together form a continuous smooth inner surface 213. The outer surface 261 of the third electrical conductor 26 and the outer surface 212' of the first electrical conductive body 21' together form a continuous smooth outer surface 212. The outer surface 281 of the second insulating structure 28 and the outer surface 231' of the insulating structure 23' together form a continuous smooth outer surface 231. In other words, after bonding another light emitting unit 20' on the removal surface S2, the bonding structure 2 is cured and has the first conductive body 21', the second conductive body 22' and the insulating structure 23' to form the conductive body 21, the second conductive body 22 and the insulating structure 23 shown in FIG. 1D. The shapes and relationships of the first conductive body 21, the second conductive body 22 and the insulating structure 23 are disclosed in FIG. 1D and the corresponding paragraphs.

Figure 5B:
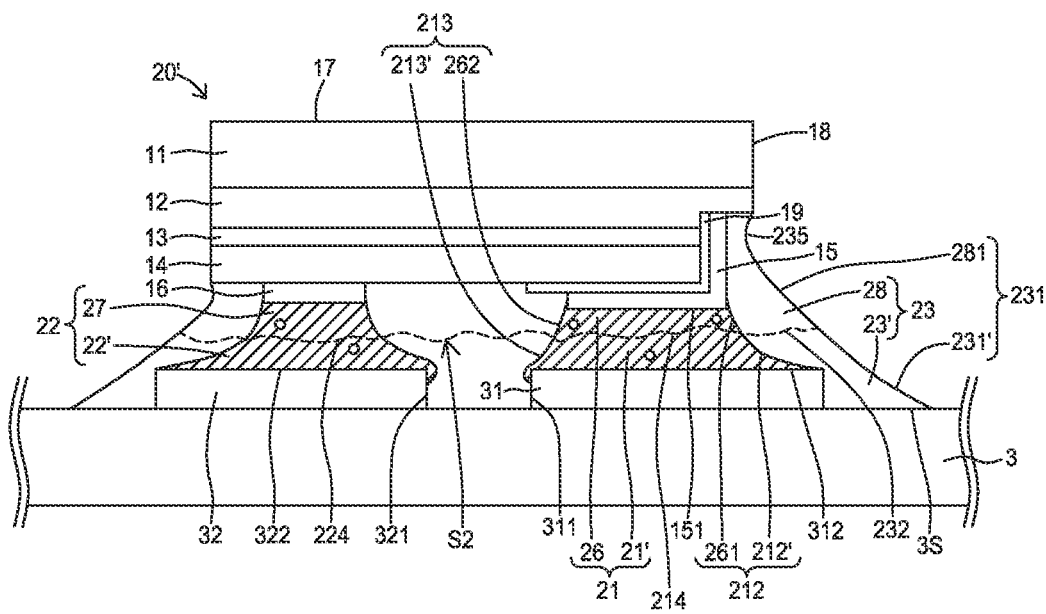
FIG. 5B shows a partial cross-sectional view of a light emitting device according to another embodiment in the present disclosure.

FIG. 5B is a partial diagram of a new light emitting unit being fixed on the removal surface S2 of the carrier board 3 according to another embodiment of the disclosure. After the bonding structure 2 is heated and cured, the second insulating structure 28 does not cover the outermost surface 18 of the light emitting unit 20'. The second insulating structure 28 directly contacts the upper surface 232 of the insulating structure 23' and form the insulating structure 23 with the insulating structure 23'. The outer surface 281 of the second insulating structure 28 and the outer surface 231' of the insulating structure 23' together form a continuous smooth outer surface 231, and the appearance of the outer surface 231 is the same as or similar to that shown in FIG. 1E. The outer surface 231 of the insulating structure 23 has a concave portion 235 retracted from the outermost surface 18 of the light emitting unit 20'. The shapes and relationships of the first conductive body 21, the second conductive body 22, and the insulating structure 23 have been disclosed in FIG. 1E and the corresponding paragraphs. In other embodiments, the light emitting unit 20' can also be the light emitting unit 10 disclosed in FIG. 1C.

Figure 6A:
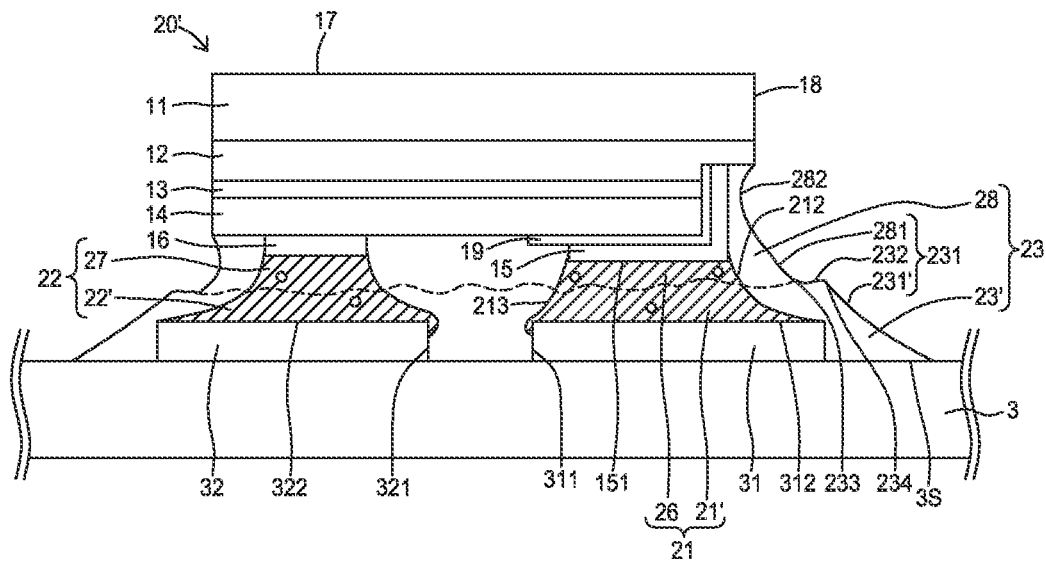
FIGS. 6A to 6C show partial cross-sectional views of light emitting devices according to other embodiments in the present disclosure.

If the quantity of the bonding structure 2 in FIGS. 4A to 4B is changed, the outer surface 231 of the insulating structure 23 in FIGS. 5A and 5B may not be a continuous smooth surface. FIG. 6A shows an embodiment that, after the new light emitting unit 20' is bonded, the outer surface 231 of the insulating structure 23 does not cover the outermost surface 18 of the light emitting unit 20' and has an discontinuous smooth surface. The outer surface 231 includes the outer surface 281 of the second insulating structure 28, the upper surface 232 of the insulating structure 23', and the outer surface 231' of the insulating structure 23'. The outer surface 281 has an inner concave surface extending from the upper surface 232 toward the light emitting unit 20' and has a recess 282 retracted from the outermost surface 18 of the light emitting unit 20'. The outer surface 231' has a curved surface extending from the carrier board 3 to the upper surface 232 and connecting the upper surface 232. The outer surface 231 of the insulating structure 23 has a curved outer surface 281, a curved outer surface 231', and an upper surface 232 which is relatively flat and substantially parallel to the upper surface 3S of the carrier plate 3 and connects the outer surface 281 and the outer surface 231'. The outer surface 231 of the insulating structure 23 has one convex or concave sharp point at the junction of the outer surfaces 281 and 232 and the junction of the outer surfaces 232 and 231', so that the outer surface 231 of the insulating structure 23 presents a discontinuous smooth surface. As shown in FIG. 6A, the outer surface 231 of the insulating structure 23 has a first juncture 233 at the junction of the outer surface 281 and the upper surface 232, and a second juncture 234 at the junction of the upper surface 232 and the outer surface 231'. The first juncture 233 is closer to the first conductive body 21 than the second juncture 234. The details of the light emitting unit 20', the first conductive body 21, the second conductive body 22, the first electrode pad 31, and the second electrode pad 32 are disclosed in aforementioned FIG. 1E and the corresponding description.

Figure 6B:
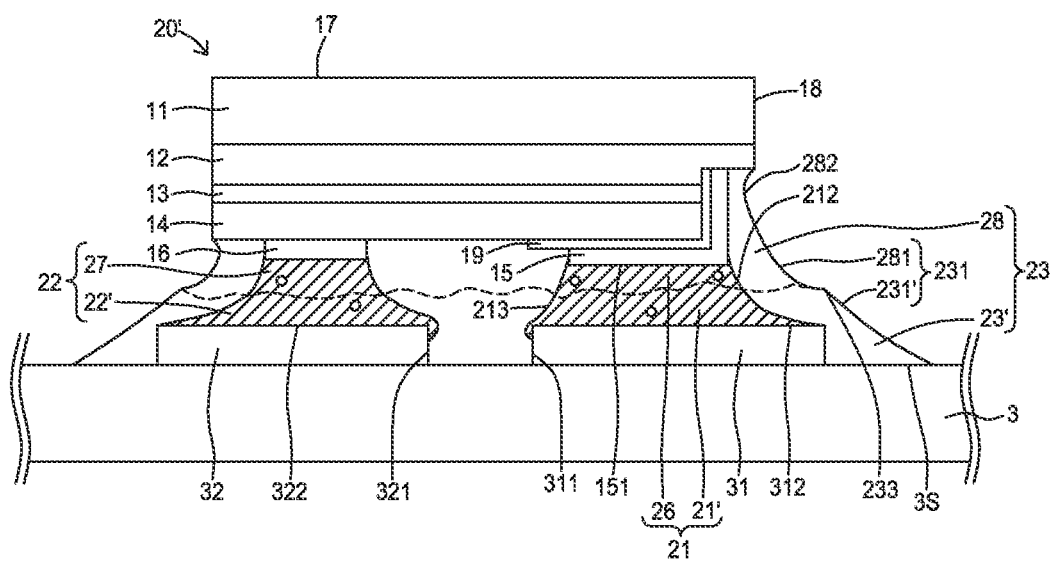
Figure 6C:
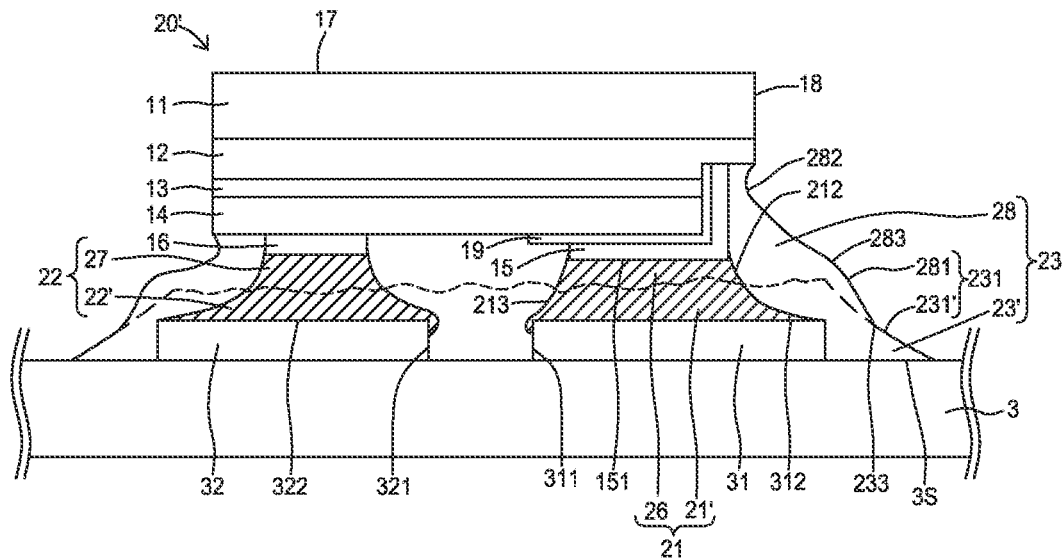

The outer surface 231 of the insulating structure 23 may also not include the upper surface 232 of the insulating structure 23' as shown in FIGS. 6B to 6C. FIG. 6B shows the new light emitting unit 20' being fixed to the carrier board 3 according to another embodiment of the disclosure. The outer surface 231 of the insulating structure 23 is a discontinuous smooth surface, which includes the outer surface 281 of the second insulating structure 28, the outer surface 231' of the insulating structure 23' and one convex sharp point at the junction of the outer surfaces 281 and 231'. The outer surface 281 is a curved surface extending from the outer surface 231' to the light emitting unit 20 and has a recess 282 retracted from the outermost surface 18 of the light emitting unit 20'. The outer surface 231' is a curved surface extending from the carrier board 3 to the outer surface 281 and connects to thereof. The outer surface 231 of the insulating structure 23 only has the first juncture 233 located at the junction of the outer surface 281 and the outer surface 231'. The detailed descriptions of the light emitting unit 20', the first conductive body 21, the second conductive body 22, the first electrode pad, and the second electrode pad 32, are disclosed in aforementioned FIG. 1E and the corresponding description.

FIG. 6C shows the new light emitting unit 20' being fixed to the carrier board 3 according to another embodiment of the disclosure. The outer surface 231 of the insulating structure 23 is a discontinuous smooth surface, which includes the outer surface 281 of the second insulating structure 28, the outer surface 231' of the insulating structure 23' and one concave sharp point at the junction of the outer surfaces 281 and 231'. The outer surface 281 is a curved surface extending from the outer surface 231' to the light emitting unit 20'. The outer surface 231' is a curved surface extending from the carrier board 3 to the outer surface 281 and connects to thereof. The outer surface 231 of the insulating structure 23 has a first juncture 233 at the junction of the outer surface 281 and the outer surface 231'. The outer surface 281 has a concave portion 282 retracted from the outermost surface 18 of the light emitting unit 20' and a convex portion 283 located outside the outermost surface 18 of the light emitting unit 20'. The convex portion 283 is closer to the first juncture 233 than the concave portion 282. In a cross-sectional view, the height of the first juncture 233 may be substantially the same as the upper surface 312 of the first electrode pad 31 or lower than the upper surface 312 of the first electrode pad 31.

Figure 7A:
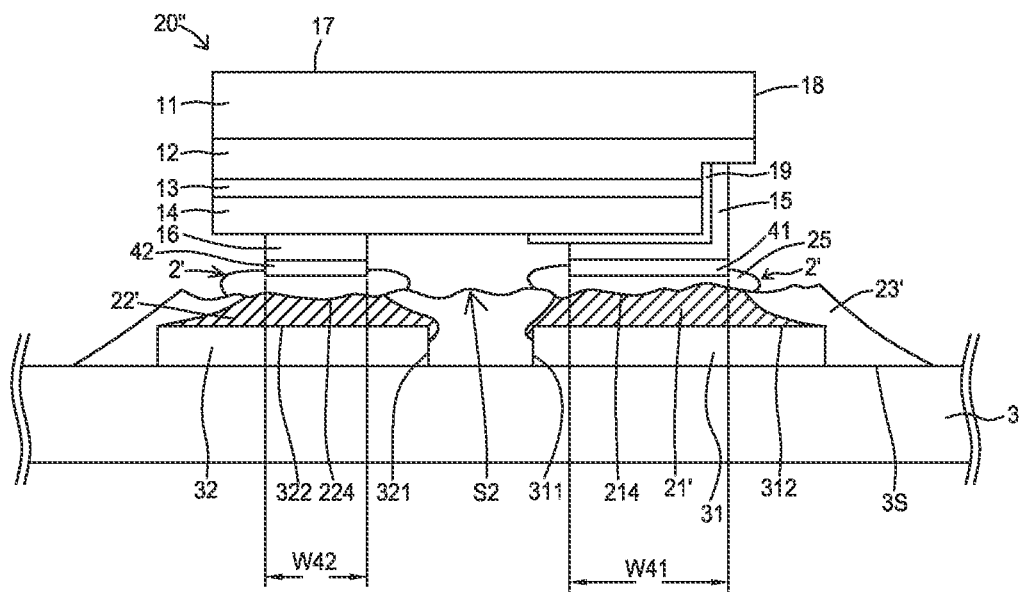
FIG. 7A shows a partial cross-sectional view of a fixed light emitting unit according to one embodiment in the present disclosure.
Figure 7B:
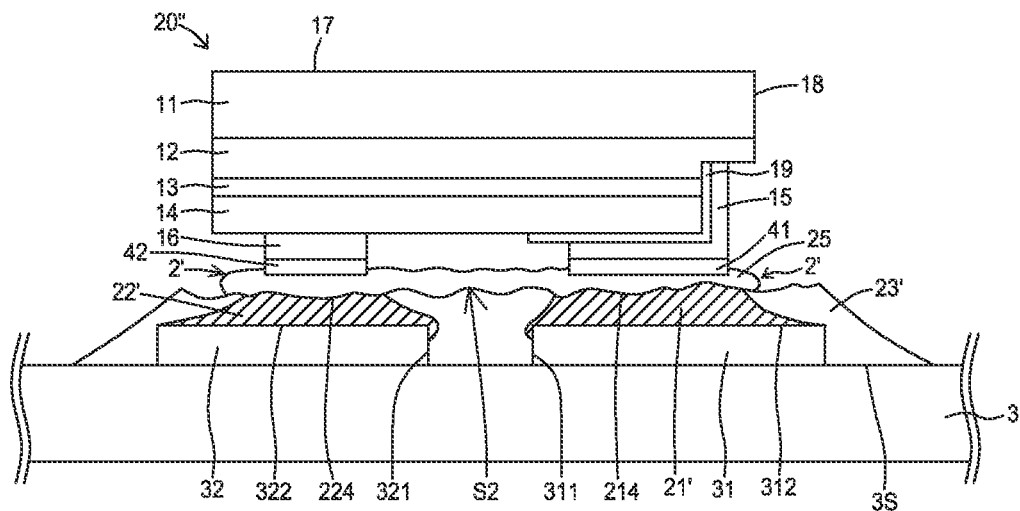
FIG. 7B shows a partial cross-sectional view of a fixed light emitting unit according to another embodiment in the present disclosure.

FIGS. 7A and 7B show the diagram of the light emitting device 100 with another new light emitting unit 20" being fixed on partial of the removal surface S2 of the carrier board 3 after one damaged light emitting unit being removed according to another embodiment of the disclosure. In other embodiments, the light emitting unit 20' may also be replaced by the aforementioned light emitting unit 10. FIG. 7A shows that there is a first conductive bump 41 under the first electrode 15 of the light emitting unit 20" and directly contacting the first electrode 15, and there is a second conductive bump 42 under the second electrode 16 of the light emitting unit 20" directly contacting the second electrode 16. The thickness of the first conductive bump 41 and the thickness of the second conductive bump 42 are about 1~12 microns. In one embodiment, the thickness of the first conductive bump 41 and the thickness of the second conductive bump 42 are about 2~10 microns. The material of the first conductive bump 41 and the second conductive bump 42 may be a metal with a low melting point or an alloy with a low liquidus point. For example, the metal can be tin or indium and the alloy can be gold tin alloy. In one embodiment, each of the first conductive bump 41 and the second conductive bump 42 has a flat bottom surface, so that they can be placed on the carrier board 3 more stably during the subsequent process for bonding the first conductive bump 41 and the second conductive bump 42 with the carrier board 3. In another embodiment, the width W41 of the first conductive bump 41 and the width W42 of the second conductive bump 42 gradually narrows from top to bottom, and the shape thereof can be a cone or a pyramid. The bonding structure 2' can fix the light emitting unit 20" on the removal surface S2. The first conductive bump 41 and the first conductive body 21' on the carrier board 3 face each other, and the second conductive bump 42 and the second conductive body 22' on the carrier board 3 face each other. The bonding structure 2' has two physically separated parts, which are respectively coated between the first conductive bump 41 and the first conductive body 21', and between the second conductive bump 42 and the second conductive body 22'. The bonding structure 2' only contains or almost contains the insulating structure 25. The insulating structure 25 may be a thermosetting polymer, such as epoxy, silicone, polymethyl methacrylate, and episulfide. The insulating structure 25 can be cured at a curing temperature. FIG. 7B shows another embodiment. The bonding structure 2' can be formed on the first conductive body 21' and the second conductive body 22' in an integrated manner. As shown in FIG. 7B, the bonding structure 2' is continuously and uninterruptedly distributed on the first conductive body 21' and the second conductive body 22'. The bonding structure 2' covers the removal surface S2, and completely or partially covers the upper surface 214 of the first conductive body 21' and the upper surface 224 of the second conductive body 22'. Preferably, the area of the removal surface S2 covered by the bonding structure 2' does not exceed the outermost edge of the removal surface S2.

The method of bonding the light emitting unit 20" to the removal surface S2 includes a thermocuring step. The thermocuring step is similar to the aforementioned disclosure in FIGS. 4A to 4B and the corresponding paragraphs. During thermocuring step, the first conductive bump 41 and the second conductive bump 42 are melted and connected to the first conductive body 21' and the second conductive body 22' on the carrier board to form the structure of the first conductor 21 and the second conductor 22 as shown in FIGS. 5 and 6. The bonding structure 2' and the insulating structure 23' together form the insulating structure 23 as shown in FIGS. 5 and 6. The detailed description is disclosed in aforementioned FIGS. 5 and 6 and the corresponding paragraphs.

Figure 8:
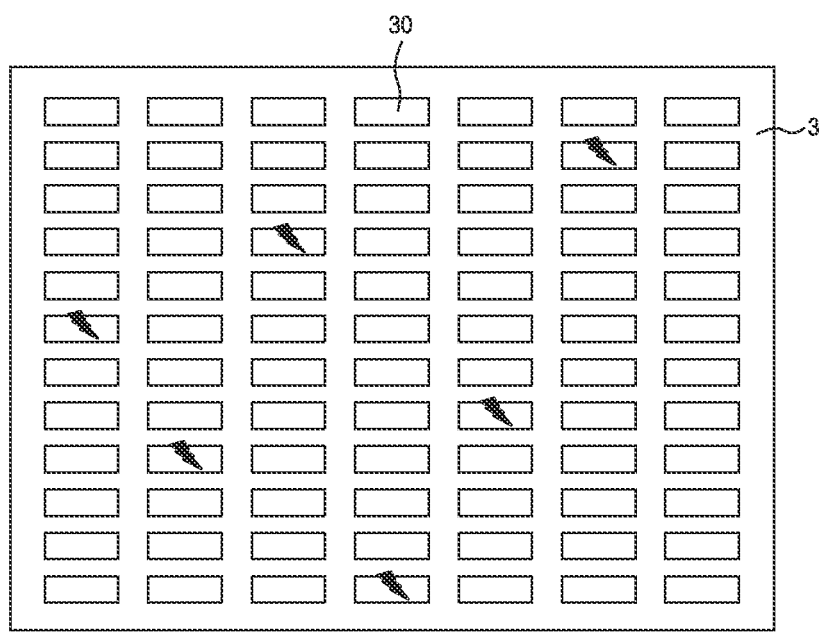
FIG. 8 shows a top view of a light emitting device according to an embodiment in the present disclosure.

FIG. 8 shows a top view of a light emitting module 1000 according to an embodiment of the disclosure. The light emitting module 1000 may include a carrier board 3 and a plurality of light emitting units 30 fixed on the carrier board 3. The plurality of light emitting units 30 may be the aforementioned light emitting unit 10 or the light emitting unit 20. The light emitting module 1000 can be a display panel or one of the light emitting modules of the display panel. Display panels can be used in applications of playing static or dynamic images, such as watches, mobile phones, dashboards, monitors, TVs, signage and/or cinemas, and in applications of projecting static or dynamic images, such as projectors and car lights. The plurality of light emitting units 30 may include light emitting units that emit different colors. For example, a light emitting units that can emit red, green, and blue light, a light emitting units that can emit cyan, red, green, and blue light, a light emitting unit that can emit yellow, red, green, and blue light, or a light emitting unit that can emit white, red, green, and blue light. In another embodiment, sensing elements can be placed on the light emitting module 1000 and on the same side as the light emitting unit 30 for image recognition, ambient light detection, monitoring of the light emitting characteristics of the adjacent light emitting unit 30, or pressure detection and other sensing applications. In another embodiment, a drive element can be placed on the light emitting module 1000 and on the same side of the light emitting unit to drive one or more light emitting units 30 adjacent to the drive element. In another embodiment, part of the light emitting units 30 may emit infrared light for transmitting control signals. In an embodiment, the light emitting units 30 on the light emitting module 1000 can be used for optical communication, and a part of the area of the light emitting module 1000 and the same side as the light emitting unit 30 can be equipped with optical communication transmission and reception communication modules. The optical communication transmission module can dynamically adjust the light intensity and light emitting time of the light emitting unit 30 according to the content of the transmitted signal. The optical communication receiving module is used to analyze the received optical communication signal. In one embodiment, the light emitting module 1000 is used in application fields that require displaying static or dynamic images, wherein a light absorbing layer like a black coating layer may be formed on the surface of the carrier board 3 between the light emitting units 30 for increasing the contrast of the display panel.

FIG. 8 shows that at least one of the light emitting units 30 or the abovementioned other elements in the light emitting module 1000 is damaged and needs to be repaired, and is removed by using the abovementioned removal method shown in FIGS. 2 to 3, and then one or more new light emitting units or/and other components are re-attached by using the abovementioned method shown in FIG. 4. The removal method can remove the damaged light emitting units 30 or the other damaged elements one by one or as a batch at a time. The re-attaching method can fix new light emitting units or/and other components one by one or as a batch at a time. The light emitting waveband, number of laser shots, and/or energy of the laser can be adjusted according to the material properties of the light emitting unit or device to be removed. In one embodiment, when the material to be removed is $Al_xIn_yGa_{(1-x-y)}P$ (where 0≤x, y≤1; (x+y)≤1), the number of shots of the laser is more than 2 times, for example, 3 times, 4 times. When the material to be removed is $Al_xIn_yGa_{(1-x-y)}N$ (where $0 \le x, y \le 1$; $(x+y) \le 1$), the number of shots of the laser is less than 2 times. In other words, the conditions of the shots of the laser for removing different materials can be different or the same. There are circuits of various sizes or materials on the carrier board 3. In order to remove materials placed on different circuits, the suitable laser parameters should be researched. For example, a circuit with a larger area may require greater energy, greater density, and longer exposure time, or higher frequency laser. Removing different materials may need using lasers with different bands.

Figure 9:
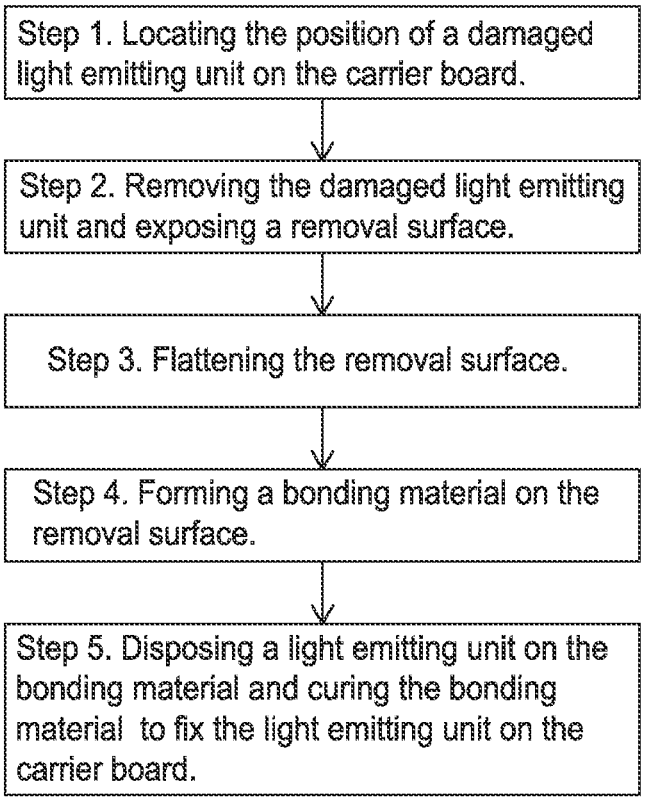
FIG. 9 shows a diagram of a process of repairing a damaged light emitting unit in a light emitting device according to one embodiment in the present disclosure.

FIG. 9 shows a diagram of a process of repairing a damaged light emitting unit or element in a light emitting device according to an embodiment of the disclosure. Step 1 is to locate the damaged light emitting unit or component on the carrier board 3. FIG. 8 shows a top view of this step. Step 2 is to use a laser to remove the damaged light emitting unit or component located in Step 1 to reveal the removal surface. The removal method can remove the damaged light emitting unit or component one by one or as a batch at a time. This removal step only removes the light emitting unit or element and a part of the bonding structure while another part of the bonding structure remains on the carrier board so the electrode pads on the carrier board are still covered by the bonding structure and are not exposed. FIG. 2 shows partial cross-sectional view of the light emitting device after Step 2 is executed. Step 3 is to flatten the removal surface exposed in Step 2. FIG. 3 shows a partial cross-sectional view of the light emitting device after Step 3 is executed. Step 4 is to form the bonding structure on the removal surface. FIGS. 4A and 4B are partial cross-sectional diagrams of the light emitting device after Step 4 is executed. Step 5 is to set a new light emitting unit on the bonding structure and cure the bonding structure to fix the light emitting unit on the carrier board. FIGS. 5 and 6 are partial cross-sectional diagrams of the light emitting device after Step 5 is executed.

Figure 10A:
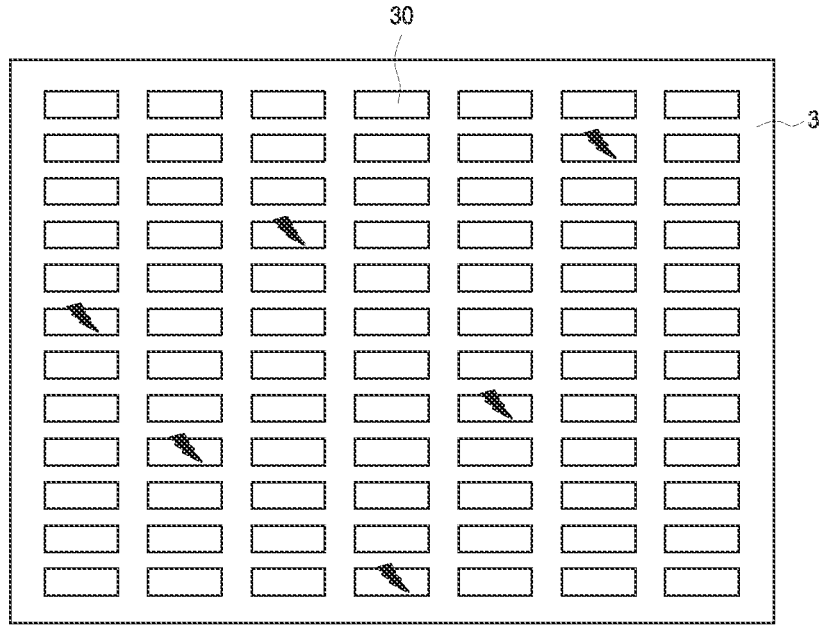
FIGS. 10A to 10B are diagrams of a light emitting array according to an embodiment in the present disclosure.
Figure 10B:
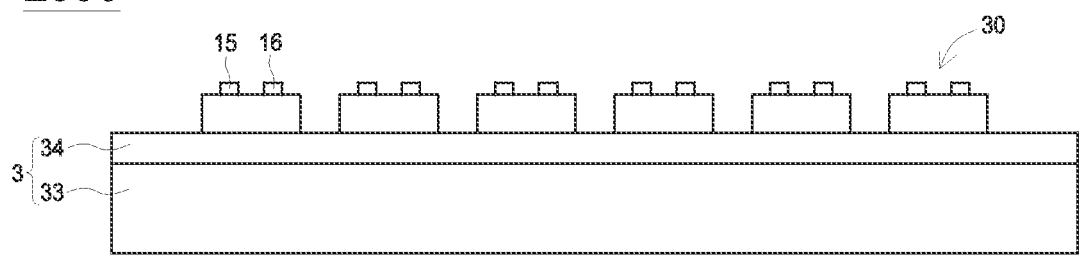

FIGS. 10A and 10B show a light emitting array 2000 according to an embodiment of the disclosure. The light emitting array 2000 carries light emitting units which can be fixed in the light emitting module, or carriers light emitting units which can be packaged into pixel packages for manufacturing a display. The light emitting units on the light emitting array 2000 can be arranged as a matrix in a specific order according to the requirements of subsequent module or package design. The light emitting units in the matrix can have the same or similar optical and electrical characteristics specification. FIG. 10A shows a top view of the light emitting array 2000. The light emitting array 2000 may include a carrier board 3, and a plurality of light emitting units 30 arranged on the carrier board 3 as a matrix according to a specific order. The light emitting unit 30 may be the aforementioned light emitting unit 10 or the light emitting unit 20. The plurality of light emitting units 30 can be an array of light emitting units with the same photoelectric characteristics, or can be light emitting units with different colors, for example, light emitting diodes that can emit red, green, blue, yellow, or cyan, which can be used as the pixels of the display panel. FIG. 10B shows a partial cross-sectional view of the light emitting array 2000. The carrier board 3 includes a support 33 and a temporary carrier 34 on the support 33. The thickness of the support 33 is thicker than the temporary carrier 34 and the hardness of the support 33 is also harder than the temporary carrier 34. The first electrode 15 and the second electrode 16 of the light emitting unit 30 are located on the side of the light emitting unit opposite to the carrier board 3. The support 33 may be a transparent hard material such as glass or sapphire. The temporary carrier 34 may be a thermal release tape, a UV tape, a chemical release tape, a heat-resistant tape, or a blue tape. When part of the light emitting unit array on the carrier board 3 is damaged or arranged incorrectly, it can also be removed using the abovementioned methods described in FIGS. 2 to 3.

Figure 11A:
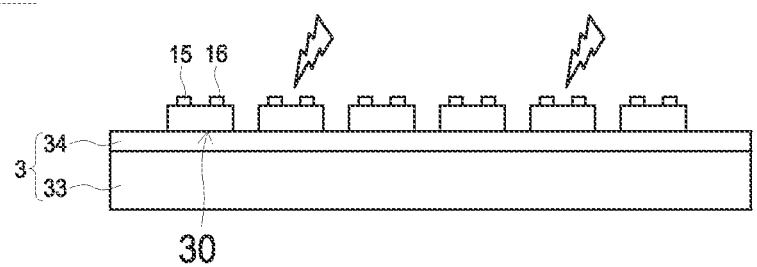
FIGS. 11A to 11F are diagrams of repairing damaged light emitting units in a light emitting array according to one embodiment in the present disclosure.
Figure 11B:
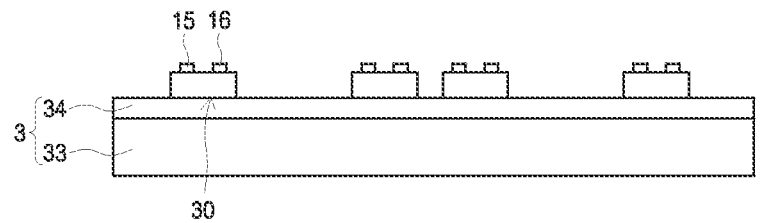
Figure 11C:
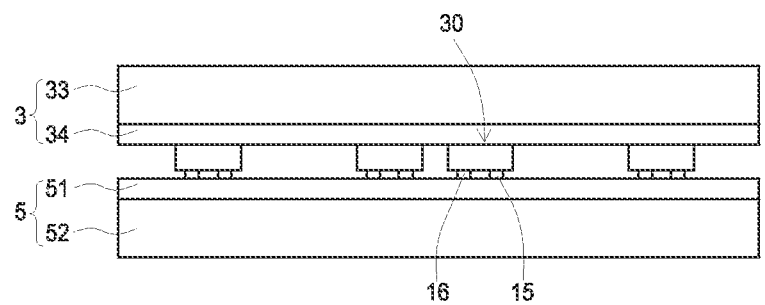
Figure 11D:
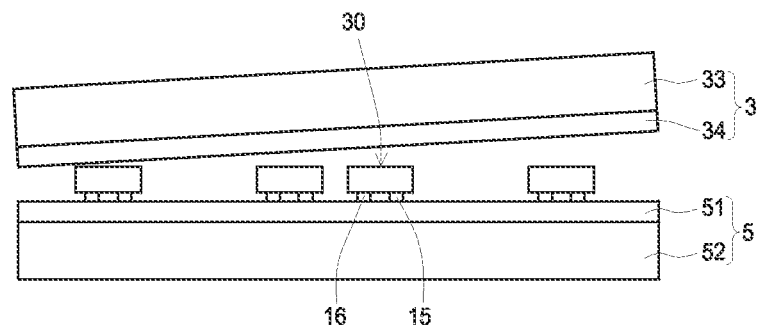
Figure 11E:
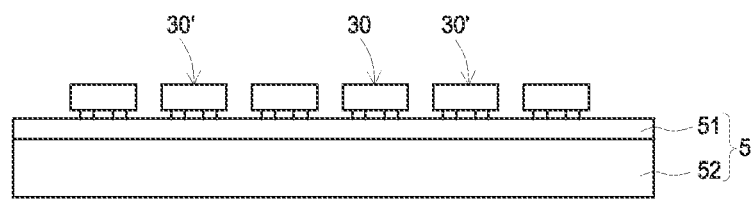
Figure 11F:
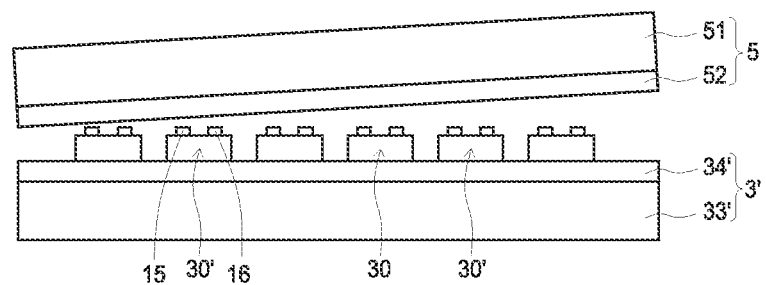

FIGS. 11A to 11F are diagrams of steps for repairing the light emitting array 2000 according to an embodiment of the disclosure. Referring to FIG. 11A, the positions of the light emitting units to be repaired on the carrier board 3 are located, and then, the light emitting units to be repaired are removed with the laser shown in FIGS. 2 to 3. The light emitting units to be repaired can be removed one at a time or all at once. Referring to FIG. 11B, because the temporary carrier 34 of the carrier board 3 has been removed by laser, there are some vacancies without light emitting units, and the characteristics of the surface of the temporary carrier 34 in the vacancies may change due to laser irradiation. Referring to FIG. 11C, the structure of FIG. 11B is turned over and a temporary supporting board 5 is provided so that the first electrode 15 and the second electrode 16 of the light emitting unit 30 face the temporary supporting board 5 and are fixed on the temporary supporting board 5. The temporary supporting board 5 may include a support body 52 and the temporary carrier 51 located on the support body 52. The materials of the support body 52 and the temporary carrier 51 are similar to the materials of the support 33 and the temporary carrier 34, wherein reference may be made to the aforementioned relevant paragraphs. Next, referring to FIG. 11D, the carrier board 3 is removed. The method of removing the temporary carrier 34 may include lighting, heating, etching, or the like. Referring to FIG. 11E, new light emitting units 30' are placed in at the vacancies of the temporary carrier board 5 where the light emitting units 30 are removed by the laser. Finally, referring to FIG. 11F, the structure shown in FIG. 11E is turned over, and another carrier board 3', whose material properties are the same as those of the carrier board 3 in FIG. 11A, is provided. The sides of the light emitting units 30, 30' opposite to sides of the first electrode 15 and the second electrode 16 are fixed on the supporting board 3', the temporary supporting board 5 is removed, and then, a repaired light emitting array 2000 can be obtained.

Figure 12A:
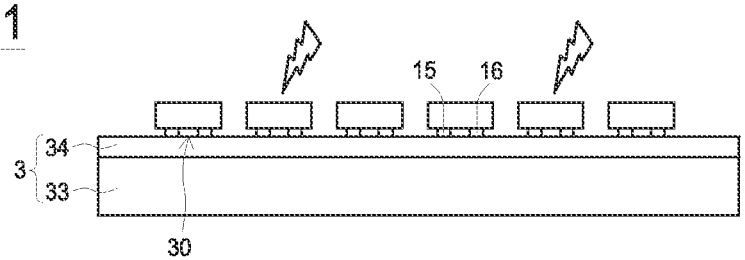
FIGS. 12A to 12D are diagrams of repairing damaged light emitting units in a light emitting array according to another embodiment in the present disclosure.
Figure 12B:
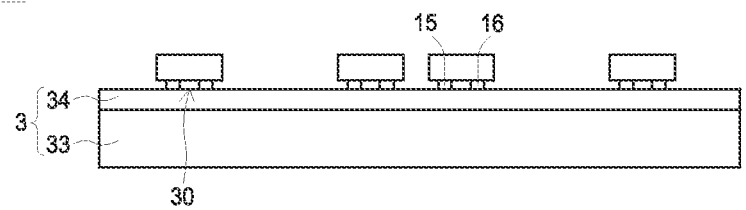
Figure 12C:
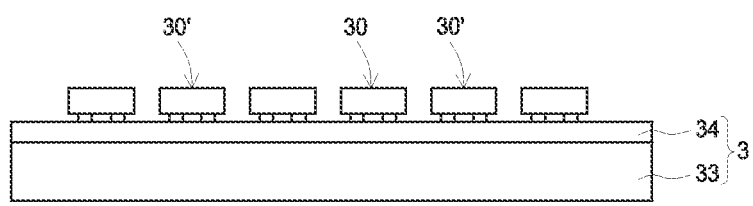

FIGS. 12A to 12D show the diagrams of the steps of repairing the light emitting unit to be repaired in a light emitting array 2001 according to another embodiment of the disclosure. Referring to FIG. 12A, the first electrodes 15 and the second electrodes 16 of the light emitting units 30 are fixed on the carrier board 3. The positions of the light emitting units to be repaired on the carrier board 3 are confirmed firstly, and the light emitting units to be repaired are removed by the laser disclosed in FIGS. 2 to 3 and the corresponding paragraphs. The method of removing the light emitting units to be repaired can be one at a time or all at once. Referring to FIG. 12B, after the light emitting units to be repaired being removed, a temporary carrier 34 of the carrier board 3 has some vacancies. The laser energy for removing the light emitting units to be repaired should be appropriately adjusted for preventing the surface of the temporary carrier 34 of the carrier board 3 from being damaged and maintaining the original bonding characteristics thereof after the light emitting units to be repaired of the light emitting array 2002 are removed. Referring to FIG. 12C, new light emitting units 30' are placed in the vacancies where the light emitting units 30 to be repaired are removed by the laser, and a repaired light emitting array 2001 can be obtained.

Figure 12D:
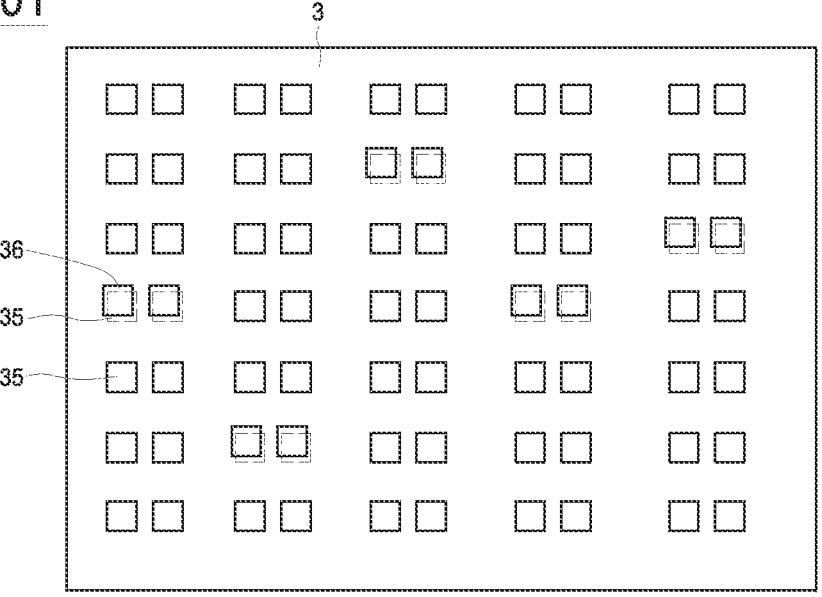

After the subsequent assembly is processed, all the light emitting units 30 and 30' are transferred from the carrier board 3 to the light emitting module or the pixel package. FIG. 12D shows a top view of the carrier board 3. The carrier board 3 has a plurality of first imprint traces 35 produced by the electrodes of the light emitting units 30 and a plurality of second imprint traces 36 produced by the electrodes of the light emitting units 30'. When the laser removal and repair steps are not performed, the traces formed by all the light emitting units 30 on the carrier board 3 are the first imprint traces 35. After the light emitting unit to be repaired is removed by the laser, the traces formed by placing the new light emitting unit 30' on the carrier board 3 are the second imprint traces 36. The second imprint trace 36 is different from the first imprint trace 35 at the same position, but most of them are overlapped with each other and does not overlap with other adjacent first imprint traces 35. The overlapping area of the second imprint trace 36 and the first imprint trace 35 at the same position is greater than 80% of the area of the second imprint trace 36.

Figure 13A:
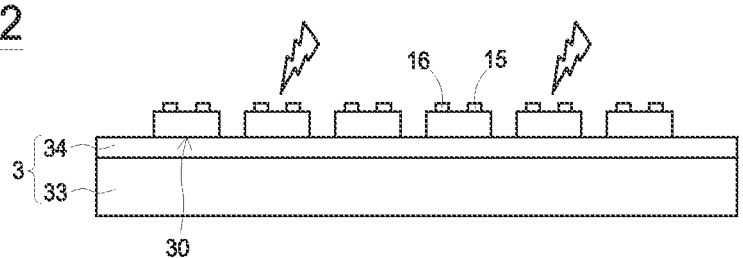
FIGS. 13A to 13D are diagrams of the carrier board of the light emitting device after repair according to one embodiment in the present disclosure.
Figure 13B:
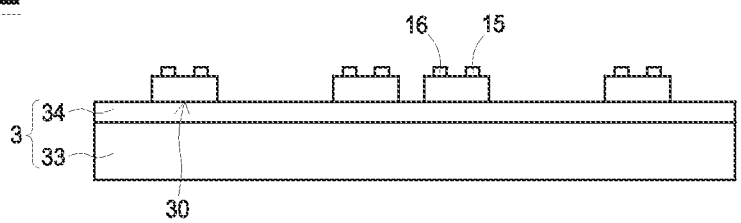
Figure 13C:
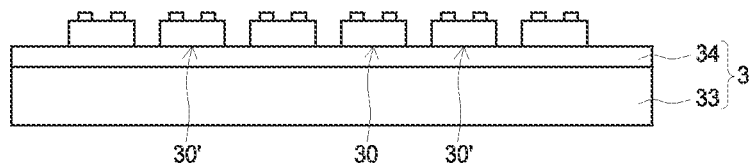
Figure 13D:
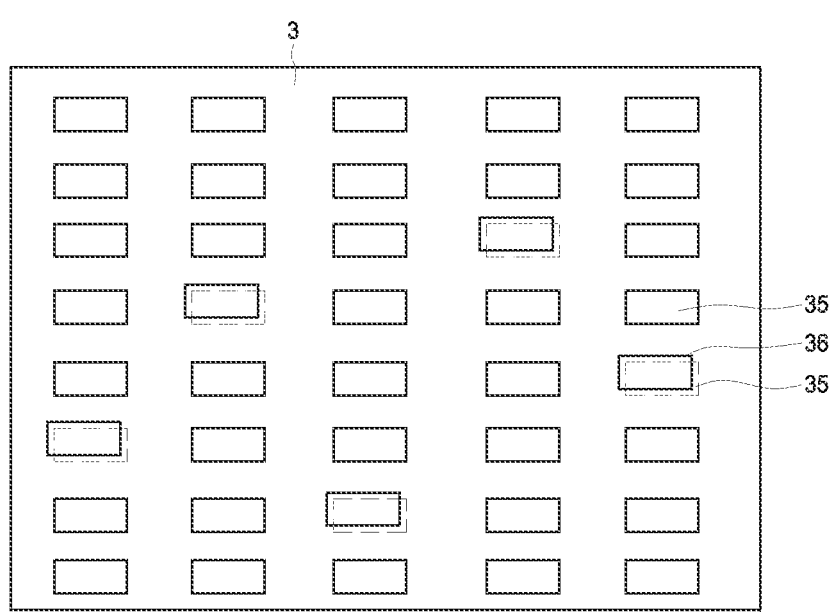

FIGS. 13A to 13D are diagrams of the steps of repairing the light emitting unit in the light emitting array 2002 according to another embodiment of the disclosure. Referring to FIG. 13A, the first electrodes 15 and the second electrodes 16 of the light emitting units 30 are located on the side of the light emitting units 30 opposite to the carrier board 3. The positions of the light emitting units to be repaired on the carrier board 3 are confirmed, and the light emitting units to be repaired are removed by the laser disclosed in FIGS. 2 to 3 and the corresponding paragraphs. The light emitting units to be repaired can be removed one at a time or all at once. Referring to FIG. 13B, after the light emitting units to be repaired are removed, the temporary carrier 34 of the carrier board 3 has some vacancies. The laser energy for removing the light emitting units to be repaired should be appropriately adjusted for preventing the surface of the temporary carrier 34 of the carrier board 3 from being damaged and maintaining the original bonding characteristics thereof after the light emitting units to be repaired of the light emitting array 2002 are removed. Referring to FIG. 13C, new light emitting units 30' are placed in the vacancies where the light emitting units 30 to be repaired are removed by the laser, and a repaired light emitting array 2002 can be obtained.

FIG. 13C shows that the light emitting units 30 and 30' of the light emitting array 2002 are arranged on and contacts the carrier board 3 in such a way that the electrodes 15, 16 face upwards. Therefore, as shown in FIG. 3D, after the light emitting units 30, 30' are transferred to another receiving substrate (not shown), the carrier board 3 has a plurality of first imprint traces 35 and a plurality of second imprint traces 36 generated by the light emitting surfaces of the light emitting units 30, 30'. The traces formed by the light emitting units 30 on the carrier board 3, which are not performed by laser removal step, are the first imprint traces 35. The traces formed by the new light emitting units 30' on the carrier 3 are the second imprint traces 36. The second imprint trace 36 is different from the first imprint trace 35 at the same position, but most of them are overlapped with each other and does not overlap with other adjacent first imprint traces 35. The overlapping area of the second imprint trace 36 and the first imprint trace 35 at the same position is greater than 80% of the area of the second imprint trace 36.

Although the present application has been explained above, it is not the limitation of the range, the sequence in practice, the material in practice, or the method in practice. Any modification or decoration for present application is not detached from the spirit and the range of such.

What is claimed is:

1. A method of repairing a light emitting array, comprising:
    providing a light emitting array comprising a first carrier board and a plurality of light emitting units arranged on the first carrier board as a matrix, wherein the matrix has one or more vacancies, each of the plurality of light emitting units comprises a first electrode with an upper surface;
    providing a second carrier board which comprises a temporary carrier having an insulating material with a top surface;
    transferring the plurality of light emitting units along with the one or more vacancies from the first carrier board to the second carrier board; and
    providing one or more new light emitting units on the second carrier board to be placed in the one or more vacancies located on the second carrier board;
    wherein, after the transferring step, the first electrode and the insulating material are overlapped with each other in a direction perpendicular to the top surface of the insulating material, the upper surface of the first electrode is located at a position higher than the top surface of the insulating material, and the plurality of light emitting units is not electrically connected to the second carrier board.

2. The method according to claim 1, further comprising a step of removing one or more light emitting units from the plurality of light emitting units on the first carrier board to form the one or more vacancies.

3. The method according to claim 2, wherein the one or more light emitting units are removed by irradiating a laser.

4. The method according to claim 1, wherein the step of transferring the plurality of light emitting units from the first carrier board to the second carrier board comprises removing the plurality of light emitting units from the first carrier board and fixing the plurality of light emitting units on the second carrier board.

5. The method according to claim 4, wherein the step of removing the plurality of light emitting units from the first carrier board comprises lighting, heating, or etching.

6. The method according to claim 1, wherein the second carrier board comprises a support body, and the temporary carrier is arranged on the support body.

7. The method according to claim 6, wherein a thickness of the support body is thicker than a thickness of the temporary carrier.

8. The method according to claim 6, wherein a hardness of the support body is harder than a hardness of the temporary carrier.

9. The method according to claim 6, wherein the temporary carrier is directly connected to the first electrode and the support body in the direction perpendicular to the top surface of the insulating material.

10. The method according to claim 1, wherein the first carrier board comprises glass or sapphire.

11. The method according to claim 1, wherein each of the plurality of light emitting units comprises a second electrode, and the first electrode and the second electrode contact the temporary carrier.

12. A method of repairing a light emitting array, comprising:
- providing a light emitting array comprising a carrier board and a plurality of light emitting units arranged on the carrier board as a matrix, wherein the carrier board comprises a temporary carrier having an insulating material with a top surface, and each of the plurality of light emitting units comprises a first electrode with an upper surface;
- removing one or more light emitting units from the plurality of light emitting units arranged on the carrier board to form one or more vacancies in the matrix; and
- providing one or more new light emitting units on the one or more vacancies located on the carrier board;
- wherein, the first electrode and the insulating material are overlapped with each other in a direction perpendicular to the top surface of the insulating material, the upper surface of the first electrode is located at a position higher than the top surface of the insulating material, and the one or more new light emitting units on the one or more vacancies is not electrically connected to the carrier board.

13. The method according to claim 12, wherein each of the plurality of light emitting units comprises a second electrode, and the first electrode and the second electrode contact the temporary carrier.

14. The method according to claim 12, wherein each of the plurality of light emitting units comprises a second electrode, and the first electrode and the second electrode are located on a side of each of the light emitting units opposite to the carrier board.

15. The method according to claim 12, wherein the one or more light emitting units are removed by irradiating a laser.

16. The method according to claim 15, wherein a number of times of irradiating the laser is at least one.

17. The method according to claim 12, wherein the carrier board comprises a support body, and the temporary carrier is arranged on the support body.

18. The method according to claim 17, wherein a thickness of the support body is thicker than a thickness of the temporary carrier.

19. The method according to claim 17, wherein a hardness of the support body is harder than a hardness of the temporary carrier.

20. The method according to claim 17, wherein the temporary carrier is directly connected to the first electrode and the support body in the direction perpendicular to the top surface of the insulating material.

* * * * *